US011446774B2

(12) United States Patent
DeMuth et al.

(10) Patent No.: US 11,446,774 B2
(45) Date of Patent: Sep. 20, 2022

(54) DYNAMIC OPTICAL ASSEMBLY FOR LASER-BASED ADDITIVE MANUFACTURING

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 251 days.

(21) Appl. No.: 15/337,610

(22) Filed: Oct. 28, 2016

(65) Prior Publication Data

US 2017/0120530 A1    May 4, 2017

Related U.S. Application Data

(60) Provisional application No. 62/248,776, filed on Oct. 30, 2015, provisional application No. 62/248,968, (Continued)

(51) Int. Cl.
*B29C 64/264* (2017.01)
*B23K 37/04* (2006.01)
(Continued)

(52) U.S. Cl.
CPC ............ *B23K 37/0408* (2013.01); *B22F 3/24* (2013.01); *B22F 10/00* (2021.01); *B22F 12/00* (2021.01);
(Continued)

(58) Field of Classification Search
None
See application file for complete search history.

(56) References Cited

U.S. PATENT DOCUMENTS 4,247,508 A   1/1981  Housholder
4,338,022 A   7/1982  Farago
              (Continued)

FOREIGN PATENT DOCUMENTS

CN    1593817 A    3/2005
DE    3029104 A1   2/1982
              (Continued)

OTHER PUBLICATIONS

Edmund Optics, "Relay Lenses", 2019 (Year: 2019).*

*Primary Examiner* — Jacob T Minskey
*Assistant Examiner* — Adrien J Bernard
(74) *Attorney, Agent, or Firm* — David R. Stevens; Stevens Law Group

(57) ABSTRACT

A method and an apparatus of a powder bed fusion additive manufacturing system that enables a quick change in the optical beam delivery size and intensity across locations of a print surface for different powdered materials while ensuring high availability of the system. A dynamic optical assembly containing a set of lens assemblies of different magnification ratios and a mechanical assembly may change the magnification ratios as needed. The dynamic optical assembly may include a transitional and rotational position control of the optics to minimize variations of the optical beam sizes across the print surface.

21 Claims, 24 Drawing Sheets

Related U.S. Application Data filed on Oct. 30, 2015, provisional application No. 62/248,829, filed on Oct. 30, 2015, provisional application No. 62/248,765, filed on Oct. 30, 2015, provisional application No. 62/248,787, filed on Oct. 30, 2015, provisional application No. 62/248,758, filed on Oct. 30, 2015, provisional application No. 62/248,821, filed on Oct. 30, 2015, provisional application No. 62/248,795, filed on Oct. 30, 2015, provisional application No. 62/248,835, filed on Oct. 30, 2015, provisional application No. 62/248,966, filed on Oct. 30, 2015, provisional application No. 62/248,833, filed on Oct. 30, 2015, provisional application No. 62/248,780, filed on Oct. 30, 2015, provisional application No. 62/248,783, filed on Oct. 30, 2015, provisional application No. 62/248,980, filed on Oct. 30, 2015, provisional application No. 62/248,791, filed on Oct. 30, 2015, provisional application No. 62/248,839, filed on Oct. 30, 2015, provisional application No. 62/248,969, filed on Oct. 30, 2015, provisional application No. 62/248,799, filed on Oct. 30, 2015, provisional application No. 62/248,848, filed on Oct. 30, 2015, provisional application No. 62/248,841, filed on Oct. 30, 2015, provisional application No. 62/248,989, filed on Oct. 30, 2015, provisional application No. 62/248,847, filed on Oct. 30, 2015, provisional application No. 62/248,770, filed on Oct. 30, 2015.

(51) Int. Cl.

| | | |
|---|---|---|
| *B29C 64/153* | (2017.01) | |
| *B33Y 10/00* | (2015.01) | |
| *B33Y 40/00* | (2020.01) | |
| *B33Y 50/02* | (2015.01) | |
| *B33Y 70/00* | (2020.01) | |
| *B33Y 80/00* | (2015.01) | |
| *B33Y 99/00* | (2015.01) | |
| *B23K 26/12* | (2014.01) | |
| *B23K 26/142* | (2014.01) | |
| *B23K 26/144* | (2014.01) | |
| *B23K 26/70* | (2014.01) | |
| *B29C 64/386* | (2017.01) | |
| *B29C 64/268* | (2017.01) | |
| *B22F 3/24* | (2006.01) | |
| *B23K 15/00* | (2006.01) | |
| *B23K 15/06* | (2006.01) | |
| *B23K 26/03* | (2006.01) | |
| *B23K 26/08* | (2014.01) | |
| *B23K 26/16* | (2006.01) | |
| *B23K 26/36* | (2014.01) | |
| *B25J 11/00* | (2006.01) | |
| *G02B 7/14* | (2021.01) | |
| *G02B 7/16* | (2021.01) | |
| *G02B 7/182* | (2021.01) | |
| *G02B 15/04* | (2006.01) | |
| *G02B 15/10* | (2006.01) | |
| *G02B 19/00* | (2006.01) | |
| *G02F 1/01* | (2006.01) | |
| *G02F 1/1333* | (2006.01) | |
| *G02F 1/135* | (2006.01) | |
| *G05B 17/02* | (2006.01) | |
| *H01S 5/40* | (2006.01) | |
| *B22F 12/00* | (2021.01) | |
| *B22F 10/00* | (2021.01) | |
| *H01S 5/00* | (2006.01) | |
| *B22F 12/33* | (2021.01) | |
| *B22F 12/44* | (2021.01) | |
| *B22F 12/70* | (2021.01) | |
| *B23K 26/00* | (2014.01) | |
| *B23K 26/082* | (2014.01) | |
| *B23K 101/00* | (2006.01) | |
| *B23K 101/24* | (2006.01) | |
| *B23K 103/00* | (2006.01) | |
| *B23K 101/02* | (2006.01) | |
| *B29K 105/00* | (2006.01) | |
| *G02B 27/28* | (2006.01) | |
| *G07C 3/14* | (2006.01) | |
| *B22F 10/10* | (2021.01) | |
| *B33Y 30/00* | (2015.01) | |
| *B23K 26/342* | (2014.01) | |
| *B28B 1/00* | (2006.01) | |
| *G02B 26/08* | (2006.01) | |
| *G02B 27/09* | (2006.01) | |
| *G02B 27/14* | (2006.01) | |
| *G02B 27/00* | (2006.01) | |

(52) U.S. Cl.
CPC .............. *B22F 12/33* (2021.01); *B22F 12/38* (2021.01); *B22F 12/44* (2021.01); *B22F 12/70* (2021.01); *B23K 15/002* (2013.01); *B23K 15/0006* (2013.01); *B23K 15/0013* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/264* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 10/10* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 26/0816* (2013.01); *G02B 27/0068* (2013.01); *G02B 27/0905* (2013.01); *G02B 27/141* (2013.01); *G02B 27/283* (2013.01); *G02B 27/286* (2013.01); *G05B 2219/49023*

(2013.01); *G07C 3/146* (2013.01); *Y02P 10/25* (2015.11); *Y02P 80/40* (2015.11)

(56) References Cited

U.S. PATENT DOCUMENTS

| | | | |
|---|---|---|---|
| 4,655,548 A * | 4/1987 | Jue | G02B 7/005 |
| | | | 348/143 |
| 4,659,902 A | 4/1987 | Swensrud | |
| 4,712,120 A | 12/1987 | Latto | |
| 4,944,817 A | 7/1990 | Bourell | |
| 5,155,324 A | 10/1992 | Deckard | |
| 5,236,637 A | 8/1993 | Hull | |
| 5,314,003 A | 5/1994 | Mackay | |
| 5,382,308 A | 1/1995 | Bourell | |
| 5,508,489 A | 4/1996 | Benda | |
| 5,536,467 A | 7/1996 | Reichle | |
| 5,640,667 A | 6/1997 | Freitag | |
| 5,674,414 A | 10/1997 | Schweizer | |
| 5,771,260 A | 6/1998 | Elliott | |
| 5,837,960 A | 11/1998 | Lewis | |
| 5,991,015 A | 11/1999 | Zamel | |
| 6,005,717 A | 12/1999 | Neuberger | |
| 6,043,475 A | 3/2000 | Shimada | |
| 6,184,490 B1 | 2/2001 | Schweizer | |
| 6,405,095 B1 | 6/2002 | Jang | |
| 6,424,670 B1 | 7/2002 | Sukhman | |
| 6,462,306 B1 | 10/2002 | Kitai | |
| 6,560,001 B1 | 5/2003 | Igasaki | |
| 6,676,892 B2 | 1/2004 | Das | |
| 6,717,106 B2 | 4/2004 | Nagano | |
| 7,088,432 B2 | 8/2006 | Zhang | |
| 7,444,046 B2 | 10/2008 | Karlsen | |
| 7,509,738 B2 | 3/2009 | Adams | |
| 7,569,174 B2 | 8/2009 | Ruatta | |
| 7,713,048 B2 | 5/2010 | Perret | |
| 7,820,241 B2 | 10/2010 | Perret | |
| 8,199,787 B2 | 6/2012 | Deri | |
| 8,514,475 B2 | 8/2013 | Deri | |
| 8,525,070 B2 | 9/2013 | Tanaka | |
| 8,525,943 B2 | 9/2013 | Burgess | |
| 8,568,646 B2 | 10/2013 | Wang | |
| 8,666,142 B2 | 3/2014 | Shkolnik | |
| 8,784,720 B2 | 7/2014 | Oberhofer | |
| 8,801,418 B2 | 8/2014 | El-siblani | |
| 8,815,143 B2 | 8/2014 | John | |
| 8,902,497 B2 | 12/2014 | Erlandson | |
| 8,982,313 B2 | 3/2015 | Escuti | |
| 9,114,478 B2 | 8/2015 | Scott | |
| 9,136,668 B2 | 9/2015 | Bayramian | |
| 9,172,208 B1 | 10/2015 | Dawson | |
| 9,186,847 B2 | 11/2015 | Fruth | |
| 9,192,056 B2 | 11/2015 | Rubenchik | |
| 9,283,593 B2 | 3/2016 | Bruck | |
| 9,308,583 B2 | 4/2016 | El-dasher | |
| 9,331,452 B2 | 5/2016 | Bayramian | |
| 9,522,426 B2 | 12/2016 | Das | |
| 9,573,193 B2 | 2/2017 | Buller | |
| 9,815,139 B2 | 11/2017 | Bruck | |
| 9,855,625 B2 | 1/2018 | El-dasher | |
| 9,962,767 B2 | 5/2018 | Buller | |
| 10,029,333 B2 | 7/2018 | Green | |
| 10,166,751 B2 | 1/2019 | Kramer | |
| 10,195,692 B2 | 2/2019 | Rockstroh | |
| 10,195,693 B2 | 2/2019 | Buller | |
| 10,279,598 B2 | 5/2019 | Deppe | |
| 10,328,685 B2 | 6/2019 | Jones | |
| 10,335,901 B2 | 7/2019 | Ferrar | |
| 2002/0015654 A1 | 2/2002 | Das | |
| 2002/0090313 A1 | 7/2002 | Wang | |
| 2002/0126727 A1 | 9/2002 | Sukhman | |
| 2002/0149137 A1 | 10/2002 | Jang | |
| 2002/0149852 A1 * | 10/2002 | Dubinovsky | H04N 9/3114 |
| | | | 359/618 |
| 2003/0052105 A1 * | 3/2003 | Nagano | B23K 26/0604 |
| | | | 219/121.83 |
| 2004/0222549 A1 | 11/2004 | Sano et al. | |
| 2005/0012246 A1 * | 1/2005 | Yoshino | B29C 64/129 |
| | | | 264/401 |
| 2005/0083498 A1 | 4/2005 | Jeng | |
| 2005/0135751 A1 | 6/2005 | Zbinden | |
| 2006/0119949 A1 | 6/2006 | Tanaka | |
| 2006/0193059 A1 * | 8/2006 | Gutierrez | G02B 15/02 |
| | | | 359/672 |
| 2007/0008311 A1 * | 1/2007 | Yoshino | B29C 64/135 |
| | | | 345/419 |
| 2007/0122560 A1 | 5/2007 | Adams | |
| 2007/0153644 A1 | 7/2007 | Corrain | |
| 2008/0035619 A1 | 2/2008 | Hamaguchi | |
| 2008/0151341 A1 | 6/2008 | Perret | |
| 2008/0158524 A1 | 7/2008 | Konno | |
| 2008/0223839 A1 | 9/2008 | Maruyama | |
| 2008/0262659 A1 | 10/2008 | Huskamp | |
| 2009/0020901 A1 | 1/2009 | Schillen | |
| 2009/0091839 A1 | 4/2009 | Kakui | |
| 2009/0206065 A1 | 8/2009 | Kruth | |
| 2009/0221422 A1 | 9/2009 | Miller | |
| 2009/0245318 A1 | 10/2009 | Clifford, Jr. | |
| 2010/0006742 A1 * | 1/2010 | Wurz | H04N 1/04 |
| | | | 250/206.1 |
| 2010/0089881 A1 | 4/2010 | Bruland | |
| 2010/0116796 A1 * | 5/2010 | Jancso | B23K 26/0884 |
| | | | 219/121.67 |
| 2010/0176539 A1 | 7/2010 | Higashi | |
| 2011/0019705 A1 | 1/2011 | Adams | |
| 2011/0033887 A1 | 2/2011 | Fang X | |
| 2011/0259862 A1 | 10/2011 | Scott | |
| 2011/0278269 A1 | 11/2011 | Gold | |
| 2012/0039565 A1 | 2/2012 | Klein | |
| 2012/0139167 A1 | 6/2012 | Fruth et al. | |
| 2012/0236425 A1 | 9/2012 | O'Neill et al. | |
| 2013/0102447 A1 | 4/2013 | Strong | |
| 2013/0112672 A1 | 5/2013 | Keremes | |
| 2013/0136868 A1 | 5/2013 | Bruck | |
| 2013/0270750 A1 | 10/2013 | Green | |
| 2013/0271800 A1 | 10/2013 | Kanugo | |
| 2013/0300286 A1 | 11/2013 | Ljungblad | |
| 2013/0302533 A1 | 11/2013 | Bruck | |
| 2014/0052285 A1 * | 2/2014 | Butcher | G05B 19/0426 |
| | | | 700/98 |
| 2014/0085631 A1 | 3/2014 | Lacour | |
| 2014/0116998 A1 * | 5/2014 | Chen | B23K 26/36 |
| | | | 219/121.78 |
| 2014/0154088 A1 | 6/2014 | Etter | |
| 2014/0252687 A1 | 9/2014 | El-dasher | |
| 2014/0263209 A1 | 9/2014 | Burris | |
| 2014/0271328 A1 | 9/2014 | Burris et al. | |
| 2014/0271965 A1 | 9/2014 | Ferrar | |
| 2014/0277679 A1 | 9/2014 | Weinberg et al. | |
| 2014/0367894 A1 | 12/2014 | Kramer | |
| 2015/0081080 A1 * | 3/2015 | Tseng | G06F 17/50 |
| | | | 700/119 |
| 2015/0097315 A1 * | 4/2015 | DeSimone | B29C 64/40 |
| | | | 264/401 |
| 2015/0132173 A1 | 5/2015 | Bruck | |
| 2015/0153544 A1 * | 6/2015 | Pedersen | H04N 5/23212 |
| | | | 348/345 |
| 2015/0165556 A1 | 6/2015 | Jones | |
| 2015/0211083 A1 | 7/2015 | Gabilondo | |
| 2015/0217403 A1 * | 8/2015 | Nakazawa | B23K 26/083 |
| | | | 219/121.68 |
| 2015/0273632 A1 | 10/2015 | Chen | |
| 2015/0283612 A1 | 10/2015 | Maeda | |
| 2015/0283613 A1 | 10/2015 | Backlund et al. | |
| 2015/0283614 A1 | 10/2015 | Wu | |
| 2015/0311064 A1 | 10/2015 | Stuart | |
| 2015/0343664 A1 | 12/2015 | Liu | |
| 2015/0360418 A1 | 12/2015 | Shah | |
| 2015/0375456 A1 | 12/2015 | Cheverton | |
| 2016/0067923 A1 | 3/2016 | James | |
| 2016/0082662 A1 | 3/2016 | Majer | |
| 2016/0114432 A1 | 4/2016 | Ferrar | |
| 2016/0175935 A1 | 6/2016 | Ladewig | |
| 2016/0236279 A1 | 8/2016 | Ashton | |
| 2016/0243652 A1 | 8/2016 | El-dasher | |

(56) References Cited

U.S. PATENT DOCUMENTS

| | | | |
|---|---|---|---|
| 2016/0279707 A1 | 9/2016 | Mattes | |
| 2016/0322777 A1 | 11/2016 | Zediker | |
| 2017/0017054 A1* | 1/2017 | Roffers et al. | B23K 26/0648 |
| 2017/0210621 A1* | 7/2017 | Schiebel | B81C 99/0095 |
| 2018/0210064 A1* | 7/2018 | Send | G01C 3/32 |

FOREIGN PATENT DOCUMENTS

| | | |
|---|---|---|
| DE | 102013205029 A1 | 9/2014 |
| EP | 0402944 A2 | 12/1990 |
| EP | 0676890 A2 | 10/1995 |
| EP | 2221132 A1 | 8/2010 |
| EP | 2875897 A1 | 5/2015 |
| EP | 2926979 A1 | 10/2015 |
| EP | 2964418 B1 | 5/2019 |
| FR | 2567668 | 7/1984 |
| GB | 2453945 A | 4/2009 |
| JP | 5933512 B2 | 6/2016 |
| WO | 2002036331 A2 | 5/2002 |
| WO | WO/2006/123641 A1 | 11/2006 |
| WO | WO/2012/151262 A2 | 11/2012 |
| WO | WO/2014/074954 A2 | 5/2014 |
| WO | WO/2014/104083 A1 | 7/2014 |
| WO | WO/2014/199134 A1 | 12/2014 |
| WO | WO/2014/199149 A1 | 12/2014 |
| WO | WO/2014/074954 A3 | 1/2015 |
| WO | WO/2015/003804 A1 | 1/2015 |
| WO | WO/2015/017077 A1 | 2/2015 |
| WO | WO 2015040433 A2 | 3/2015 |
| WO | WO/2015/108991 A1 | 7/2015 |
| WO | WO/2015/120168 A1 | 8/2015 |
| WO | WO/2015/191257 A1 | 12/2015 |
| WO | WO/2015/134075 A3 | 1/2016 |
| WO | WO/2016/071265 A1 | 5/2016 |
| WO | WO/2016/079496 A3 | 6/2016 |
| WO | WO/2016/110440 A1 | 7/2016 |
| WO | WO/2016/201309 A1 | 12/2016 |
| WO | WO/2018/087218 A1 | 5/2018 |

\* cited by examiner

DYNAMIC OPTICAL ASSEMBLY FOR LASER-BASED ADDITIVE MANUFACTURING

CROSS REFERENCE TO RELATED PATENT APPLICATION

The present disclosure is part of a non-provisional patent application claiming the priority benefit of
U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure generally relates to a dynamic optical assembly suitable for a hot or cold swap of imaging lenses capable of high-resolution imaging of an additive print job, more particularly, to control the magnification ratio and image plane location over a print surface for the print job.

BACKGROUND

In powder bed fusion additive manufacturing, a source image of an optical beam of sufficient energy is directed to locations on the top surface of a powder bed (print surface) to form an integral object when a powdered material is processed (with or without chemical bonding). The resolution (or a pixel size) of an optical system used for powder bed fusion additive manufacturing depends on whether the print surface coincides with the focal plane of the final optics in the optical system, or in term for imaging systems, depending on whether the distance between lenses and image planes for optics performing an imaging operation stays substantially a constant distance for a given lens configuration. To be able to print large objects in powder bed fusion additive manufacturing, accurate control of the image location on the print surface, and distance between lenses is necessary to maintain the resolution or the pixel size on every possible location of the top surface of the powder bed. Different powdered materials may require different intensities or energies of the optical beam as the respective thresholds of bonding energies are different. If a change in the intensity is required when changing the powder type or the powder size distribution, the optical system may need to be shut down for re-installation and re-alignment of the imaging lenses.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1A:
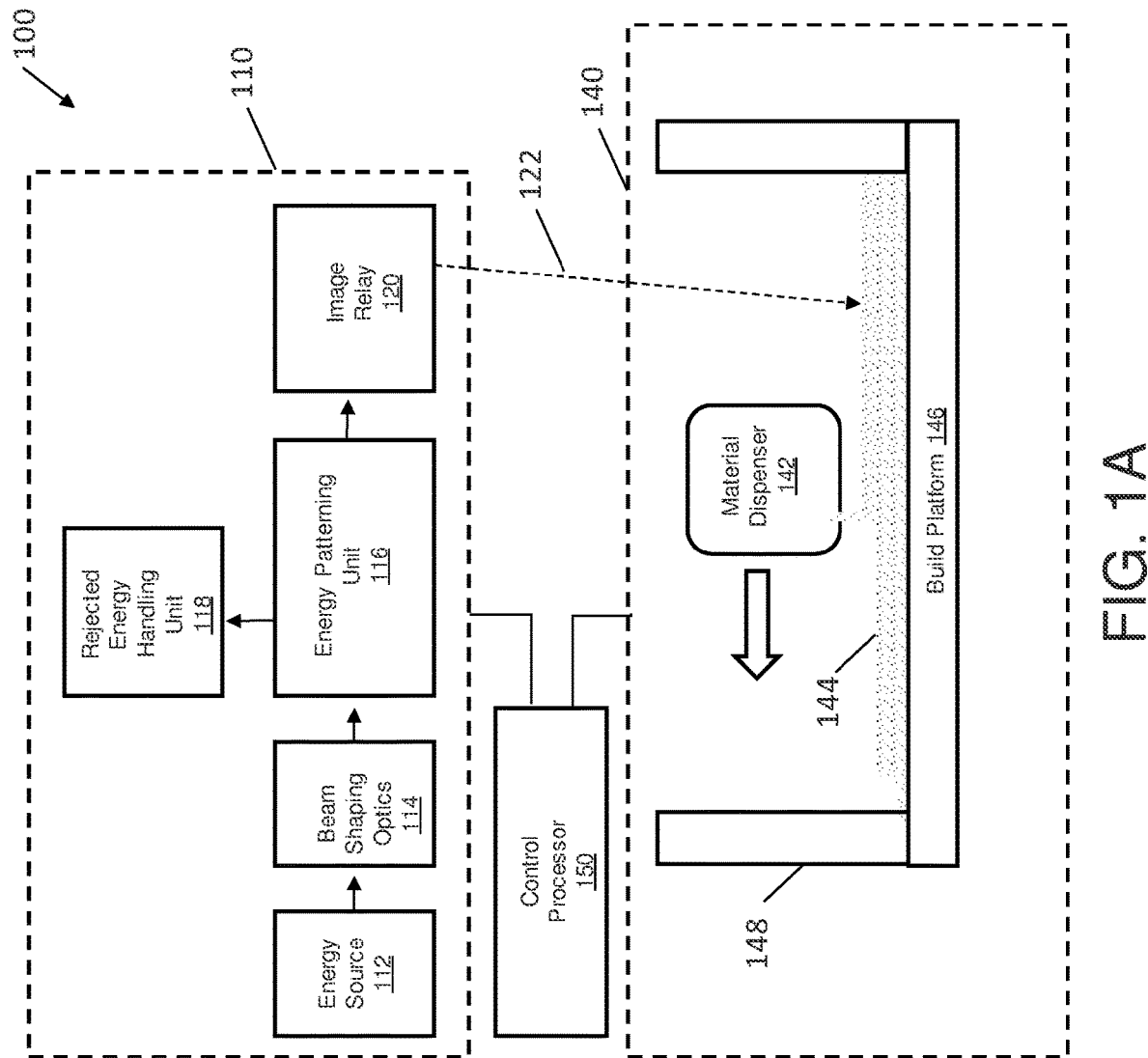
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure describes a dynamic optical assembly in a powder bed fusion additive three-dimensional manufacturing system suitable for on-the-fly swapping of imaging lens(es) and high-resolution imaging of high average power light sources in forming a large three-dimensional object. Swapping can include both physically replacing, or the modification of a lens such that it has the effect of being a different lens.

In various embodiments in accordance with the present disclosure, a dynamic optical assembly may allow swapping of imaging lens without the need to disassemble the optical assembly to enable different magnification ratios between the source image plane and locations on the top surface of a powder bed. Different magnification ratios entail that the same amount of laser power is distributed over different areas, the specific degree of which may be tuned according to different material types. In some embodiments, the same optical beam may be used for different chambers containing different powdered materials, the dynamic optical assembly of the present disclosure may deliver an appropriate power flux to each chamber while fully utilizing the power capabilities of the light source.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/MnCl$_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate (Nd:YVO$_4$) laser, Neodymium doped yttrium calcium oxoborateNd:YCa$_4$O(BO$_3$)$^3$ or simply Nd:YCOB, Neodymium glass (Nd:Glass) laser, Titanium sapphire (Ti:sapphire) laser, Thulium YAG (Tm:YAG) laser, Ytterbium YAG (Yb:YAG) laser, Ytterbium:2O$_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride (Ce:LiSAF, Ce:LiCAF), Promethium 147 doped phosphate glass (147Pm$^{+3}$:Glass) solid-state laser, Chromium doped chrysoberyl (alexandrite) laser, Erbium doped anderbium-ytterbium co-doped glass lasers, Trivalent uranium doped calcium fluoride (U:CaF$_2$) solid-state laser, Divalent samarium doped calcium fluoride (Sm:CaF$_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroic) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
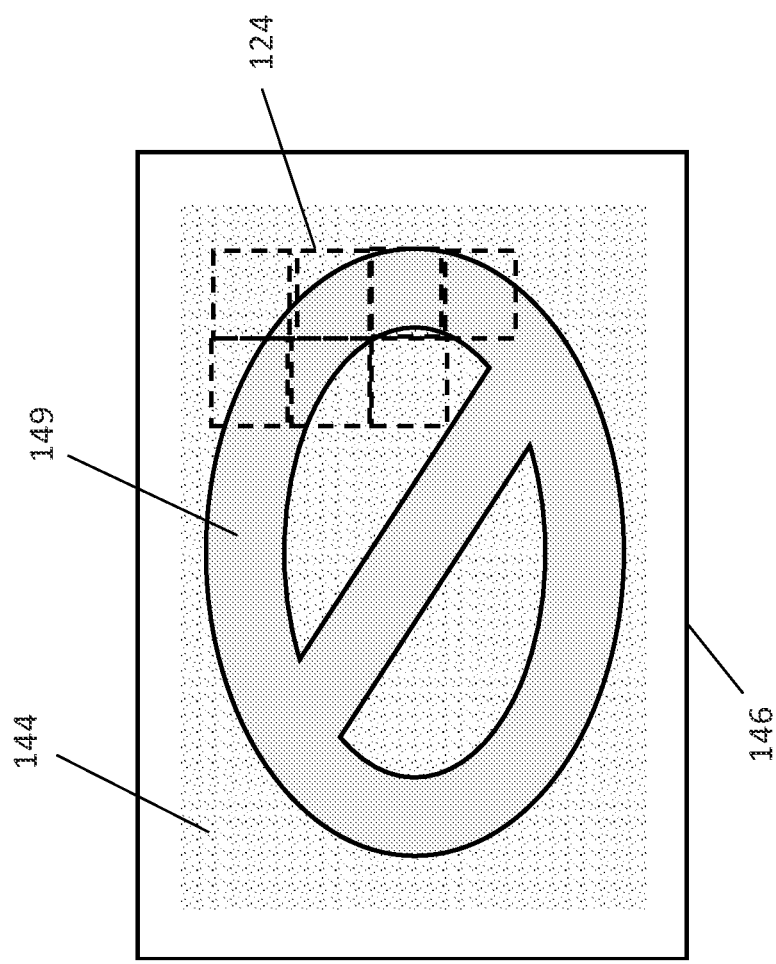
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
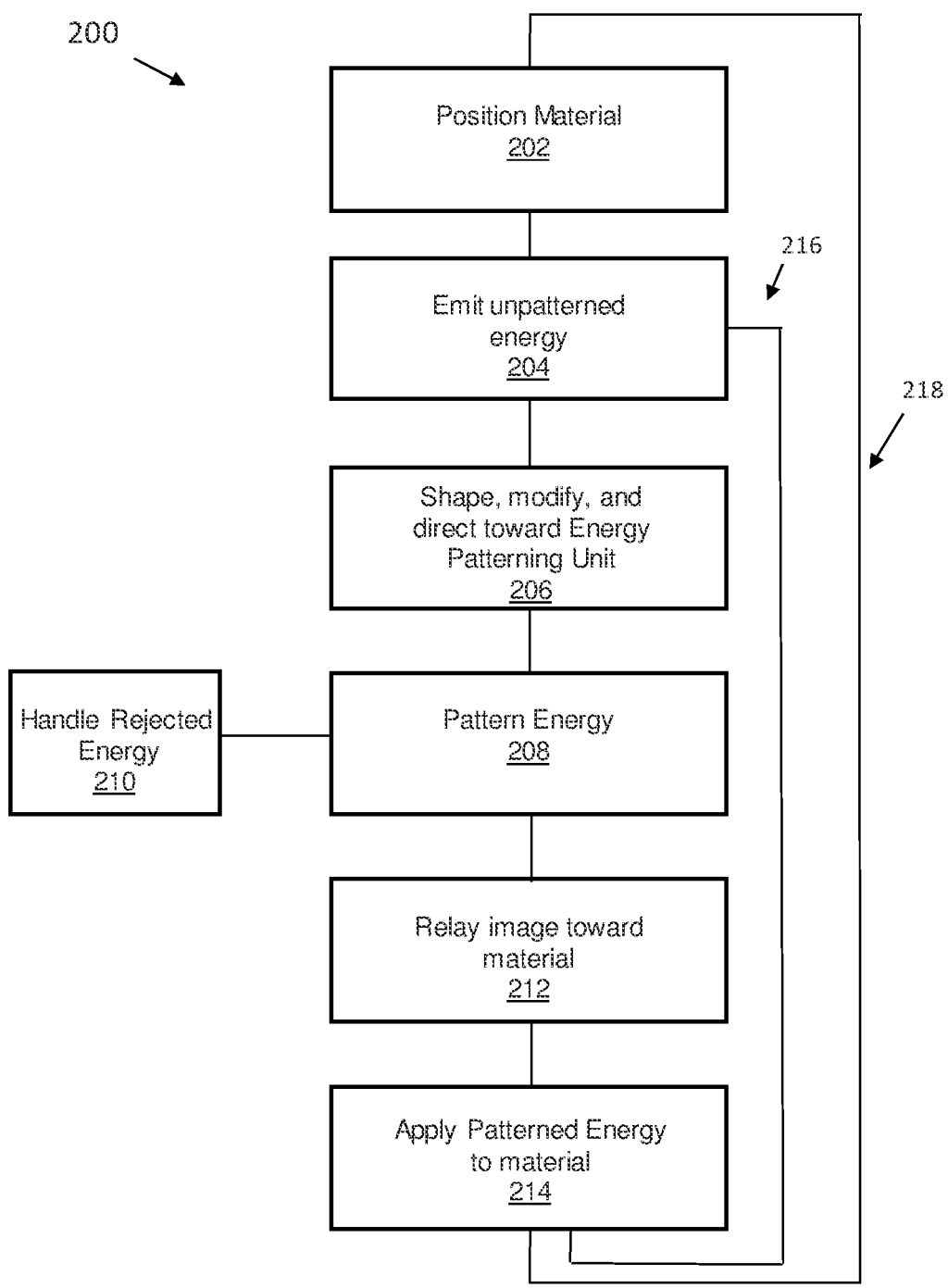
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
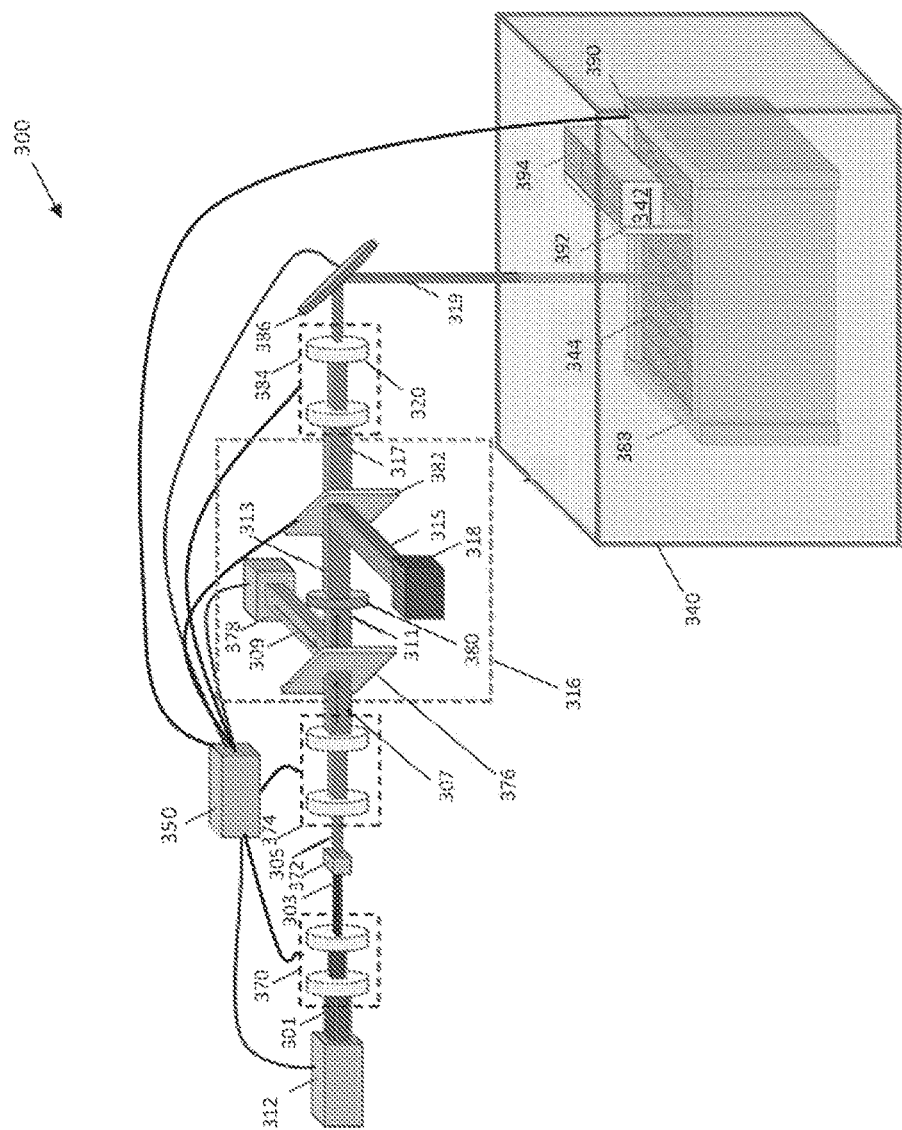
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
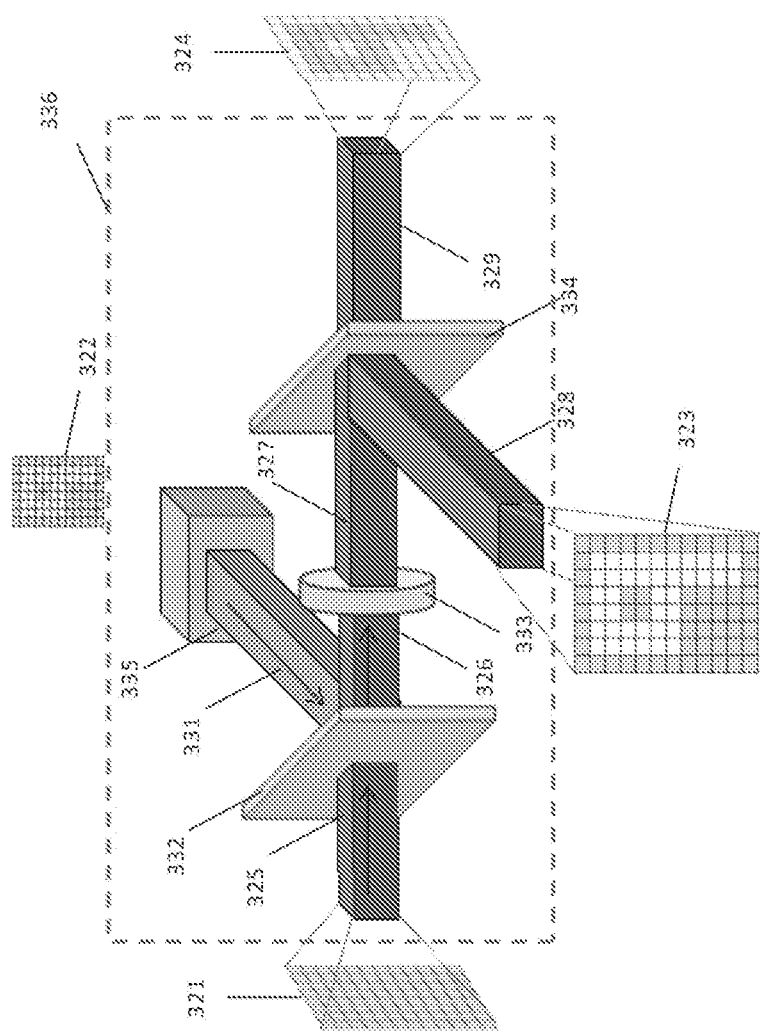
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
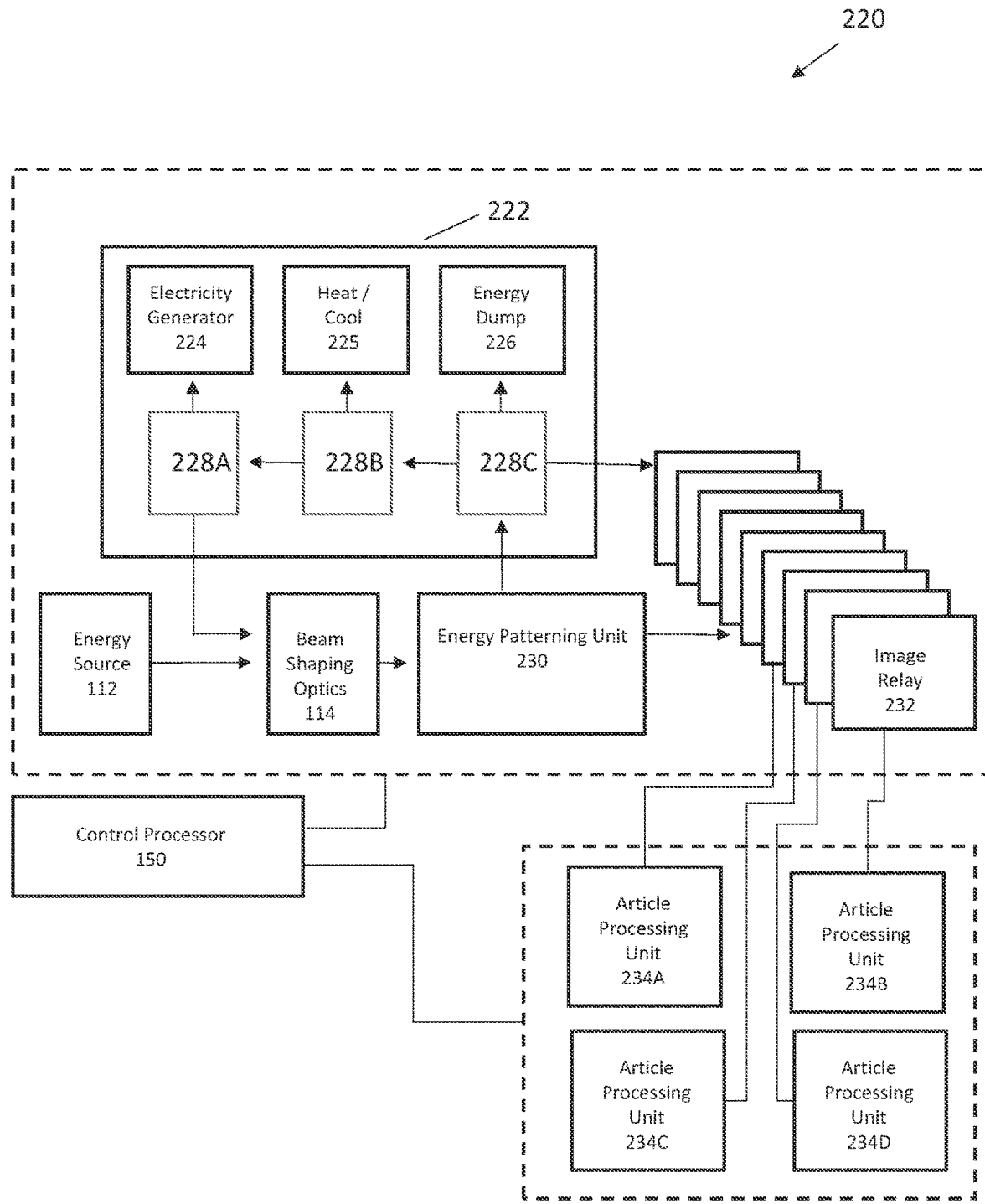
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
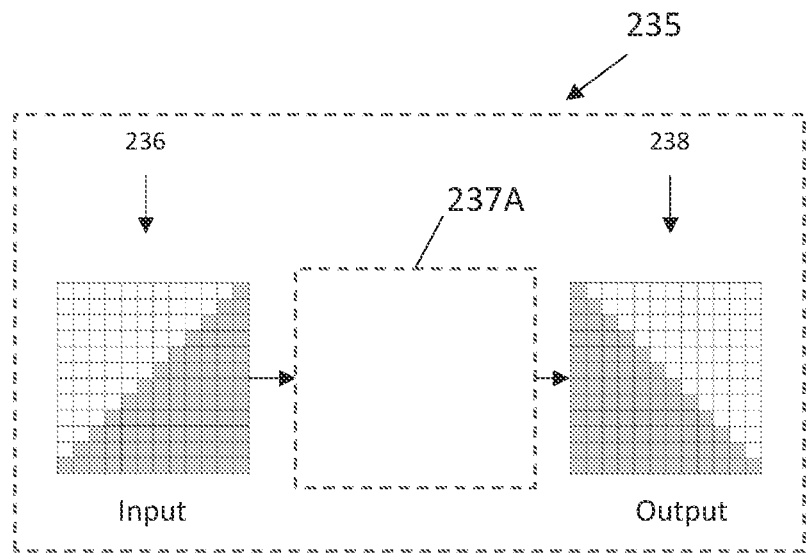
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
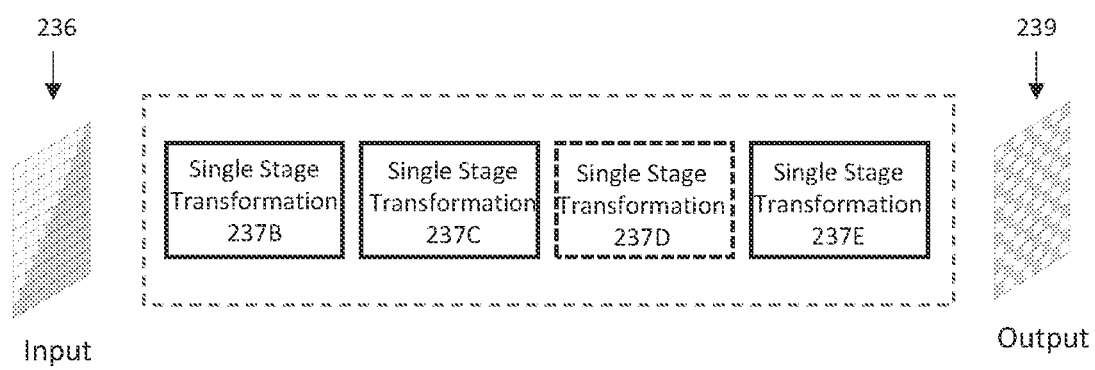
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
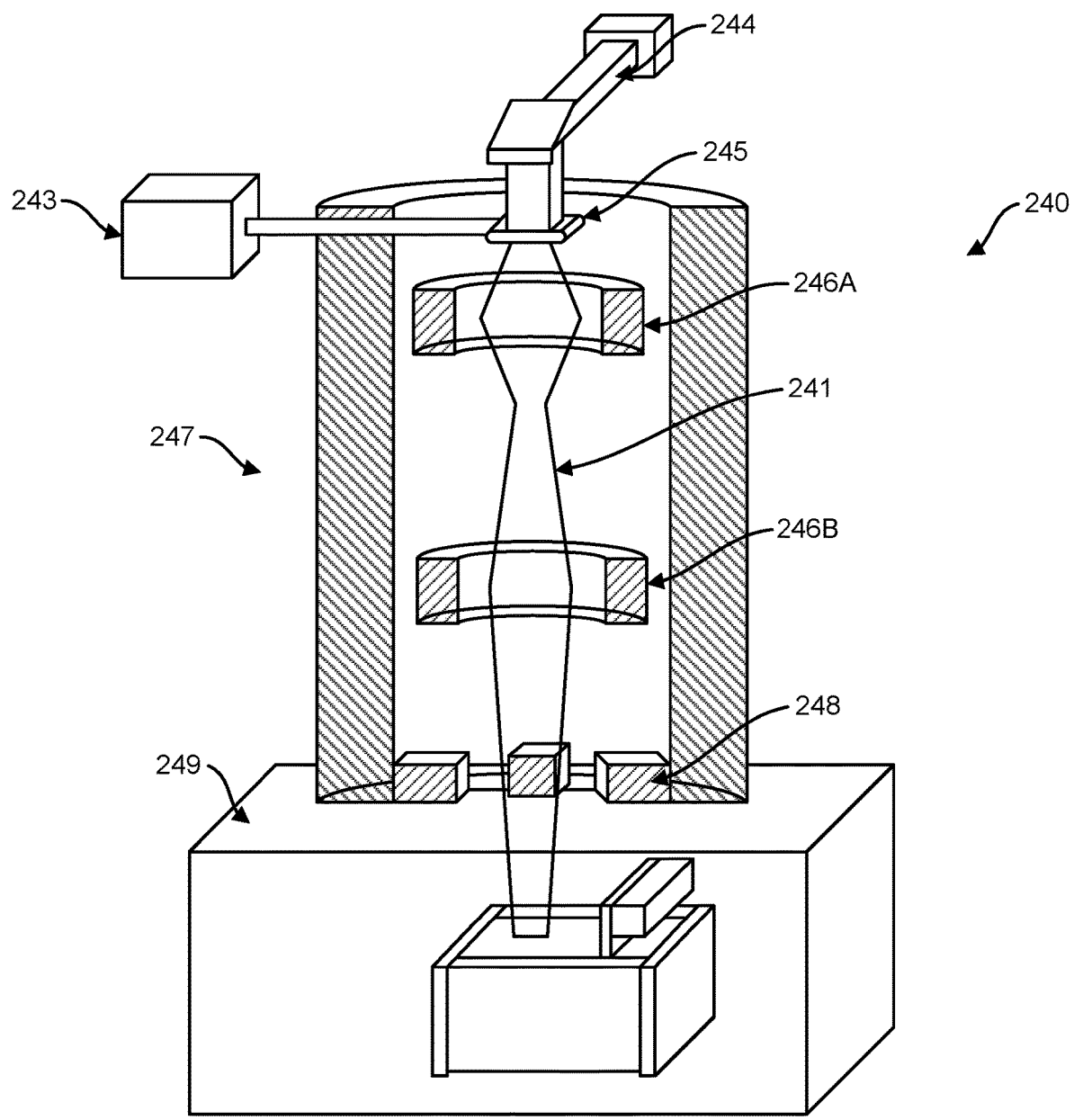
FIG. 3F illustrates an patternable electron energy beam additive manufacturing system.
Figure 3G:
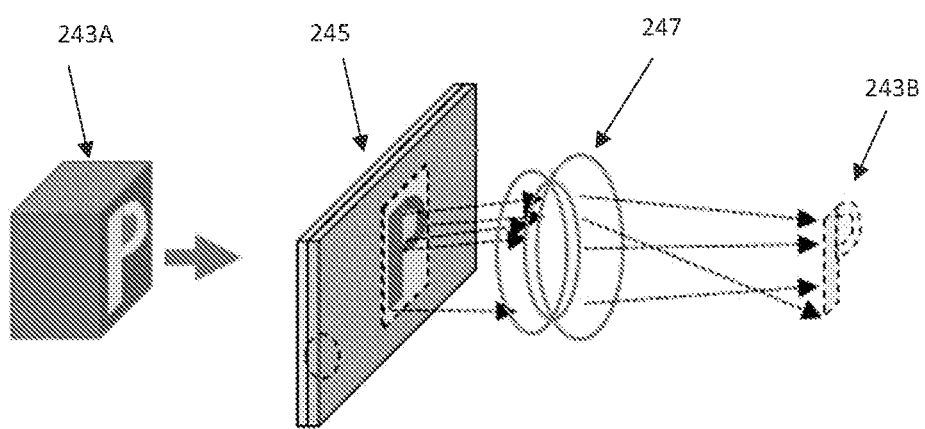
FIG. 3G illustrates a detailed description of the electron beam patterning unit shown in FIG. 3F

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
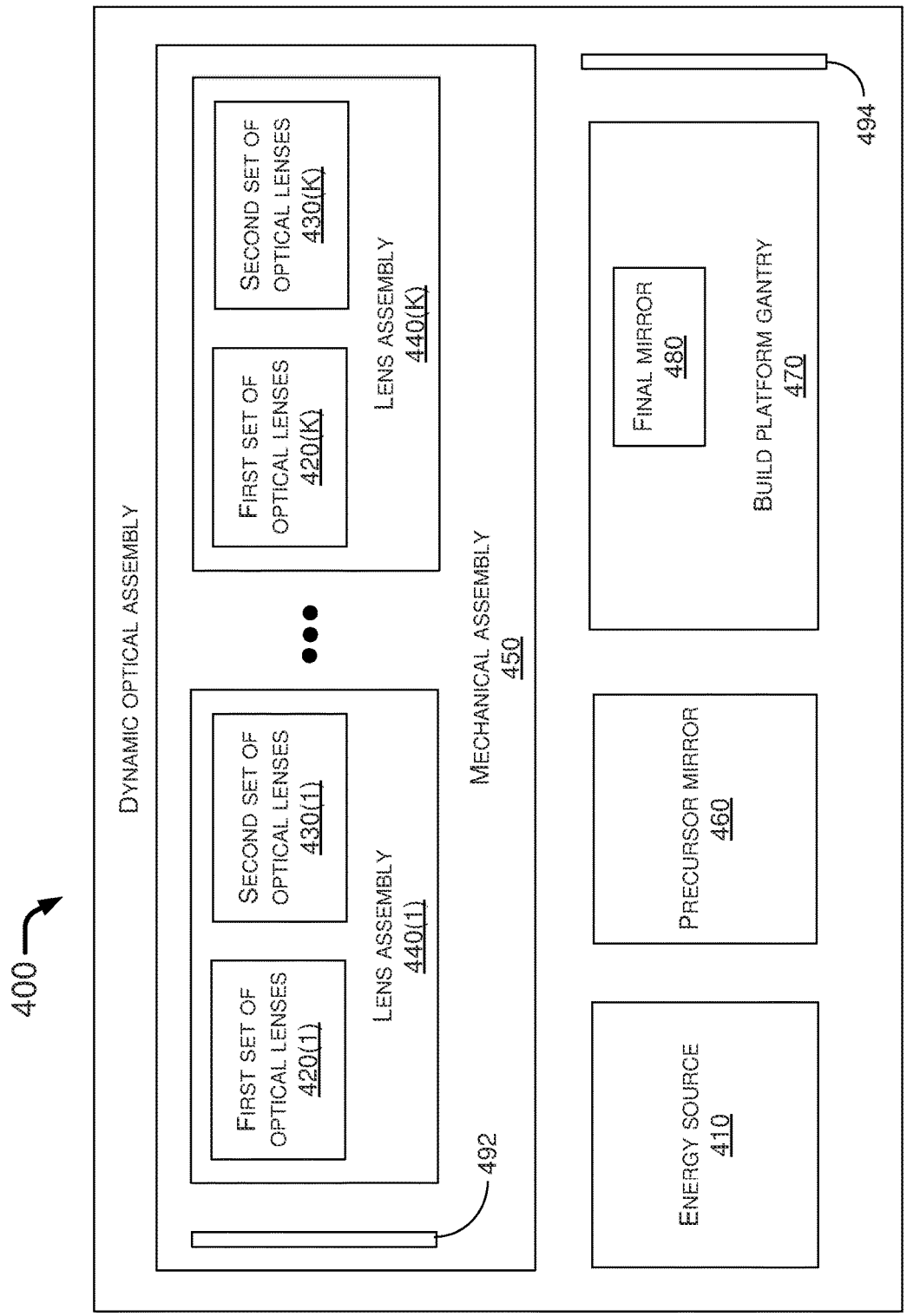
FIG. 4 is a block diagram depicting an example apparatus of a dynamic optical assembly capable of configuring a magnification ratio in accordance with an embodiment of the present disclosure.

FIG. 4 is an example apparatus of dynamic optical assembly 400 capable of configuring a magnification ratio on the fly for different powdered materials without shutting down the additive manufacturing system and re-installing the optics assembly. Dynamic optical assembly 400 may perform various functions related to techniques, methods and systems described herein, including those described below with respect to process 1700. Dynamic optical assembly 400 may be installed in, equipped on, connected to or otherwise implemented in a laser-based powder bed fusion additive manufacturing system as described above with respect to FIGS. 1A-3B to effect various embodiments in accordance with the present disclosure. Dynamic optical assembly 400 may include at least some of the components illustrated in FIG. 4.

Dynamic optical assembly 400 may include a mechanical assembly 450 which may include a set of lens assemblies 440(1)-440(K), with K being a positive integer. Each of the lens assemblies 440(1)-440(K) may be associated with a respective magnification ratio which magnifies a first image in a specified precursor image plane 492 located before the first lens of lens assemblies 440(1)-440(K) to a second image of the same or different size on the print surface-final image plane 494. Mechanical assembly 450 may be operable to select, switch, or position one of the lens assemblies 440(1)-440(K) to receive an incident light beam provided by an energy source 410 (e.g., solid state or semiconductor laser). The operation of mechanical assembly 450 described above may result in no interruptions of additive manufacturing when changing the powdered materials and, therefore, ensue high availability of the additive manufacturing system.

The lens assemblies 440(1)-440(K) may include a plurality of first sets of optical lenses 420(1)-420(K) and a plurality of second sets optical lens 430(1)-430(K), respectively. That is, each lens assembly 440(Y) of lens assemblies 440(1)-440(K) may respectfully include a respective first set of optical lenses 420(Y) and a respective second set of optical lenses 430(Y), where Y is between 1 and K. Second sets of optical lenses 430(1)-430(K) may be detachable from the lens assemblies 440(1)-440(K) to allow a swap or a removal of second sets of optical lenses 430(1)-430(K) from the lens assemblies 440(1)-440(K). A swap or a removal of second sets of optical lenses 430(1)-430(K) may allow further tuning in configuring a magnification ratio for a powdered material since each powdered material may have a different threshold of bonding energy. Swapping or removing of second sets of optical lenses 430(1)-430(K) may be performed manually or, alternatively, automatically by operations of mechanical assembly 450.

In some embodiments, dynamic optical assembly 400 may further include a precursor mirror 460 and a build platform gantry 470 with a final mirrors 480 mounted on build platform gantry 470. Build platform gantry 470 may be mounted at a vertical distance above a powder bed. Precursor mirror 460 may be capable of rotations and may direct an incident light received from one of the lens assemblies 440(1)-440(K) to final mirror 480. Final mirror 480 on build platform gantry 470 may be capable of translational movements in two degrees of freedom and rotations in one degree of freedom to receive the incident light from precursor mirror 460 and direct the incident light toward the powder bed, e.g., the build area of a printed object.

Figure 5:
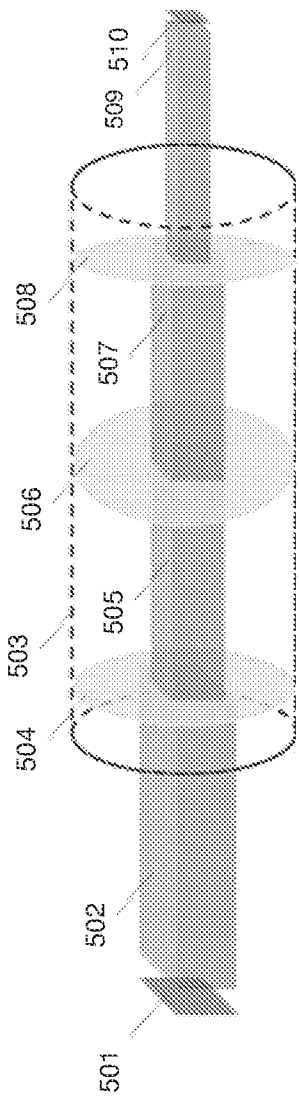
FIG. 5 is an example implementation of a lens assembly for a 4× de-magnification in accordance with an embodiment of the present disclosure.

FIG. 5 illustrates a lens assembly 503 for laser-based powder bed fusion additive manufacturing showing 4× de-magnification. Lens assembly 503 may be an implementation of lens assembly 440(1)-440(K) in apparatus 400. In the example shown in FIG. 5, a beam of 1000 nm laser light 502, 5 cm wide and 5 cm tall, contains image information in plane 501. Lens assembly 503, which includes a convex lens 504, a convex lens 506, and a convex lens 508 aligned along an optical axis of lens assembly 503, causes a 4× de-magnification in the laser beam and re-creates the image of plane 501 on plane 510. Beam 502 passes through convex lens 504 to form beam 505 which passes through convex lens 506 to form beam 507 which passes through convex lens 508 to form beam 509 which is incident on a top surface of a powder bed at plane 510 in a 2.5 cm wide by 2.5 cm tall square.

Figure 6:
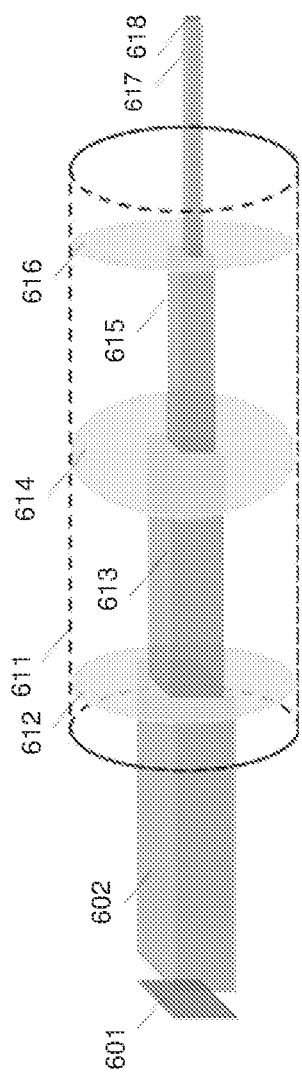
FIG. 6 is another example implementation of a lens assembly for a 25× de-magnification in accordance with an embodiment of the present disclosure.

FIG. 6 illustrates a lens assembly 611 for laser-based powder bed fusion additive manufacturing showing 25× de-magnification. Lens assembly 611 may be an implementation of lens assembly 440(1)-440(K) in apparatus 400. In the example shown in FIG. 6, a beam of 1000 nm laser light 602, 5 cm wide and 5 cm tall, contains image information in plane 601. Lens assembly 611, which includes a convex lens 612, a convex lens 614, and a convex lens 616 aligned along an optical axis of lens assembly 611, causes a 4× de-magnification in the laser beam and re-creates the image of plane 601 on plane 618. Beam 602 passes through convex lens 612 to form beam 613 which passes through convex lens 614 to form beam 615 which passes through convex lens 616 to form beam 617 which is incident on a top surface of the powder bed at plane 618 in a 1 cm wide and 1 cm tall square.

Figure 7:
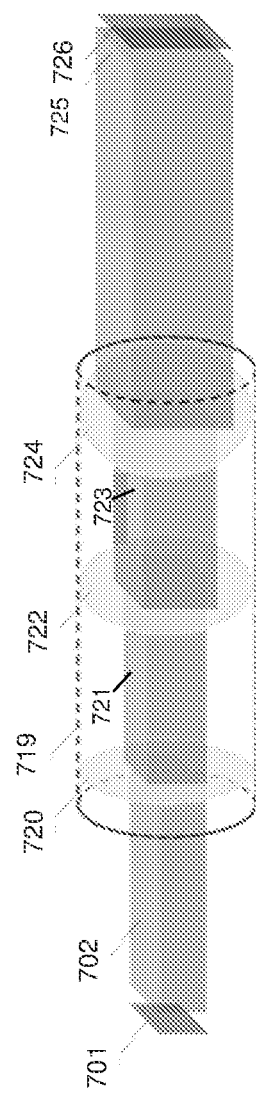
FIG. 7 is another example implementation of a lens assembly for a 4× magnification in accordance with an embodiment of the present disclosure.

FIG. 7 illustrates a system 700 having a lens assembly 719 for laser-based powder bed fusion additive manufacturing showing 4× magnification. Lens assembly 719 may be an implementation of lens assembly 440(1)-440(K) in apparatus 400. In the example shown in FIG. 7, a beam of 1000 nm laser light 702, 5 cm wide and 5 cm tall, contains image information in plane 701. Lens assembly 719, which includes a concave lens 720, a concave lens 722, and a concave lens 724 aligned along an optical axis of lens assembly 719, causes a 4× magnification in the laser beam and re-creates the image of plane 701 on plane 726. Beam 702 passes through concave lens 720 to form beam 721 which passes through concave lens 722 to form beam 723 which passes through concave lens 724 to form beam 725 which is incident on a top surface of the powder bed at plane 726 in a 10 cm by 10 cm square.

Figure 8:
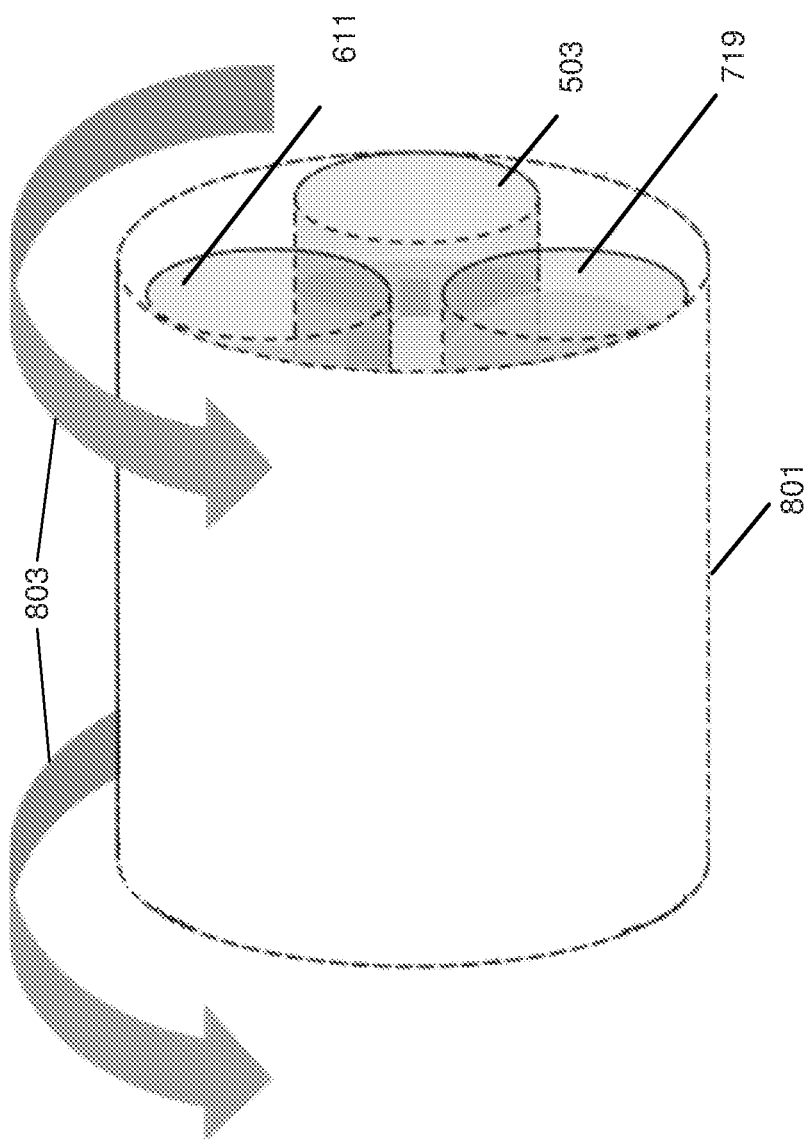
FIG. 8 is an example implementation of a mechanical assembly containing a set of lens assemblies in accordance with an embodiment of the present disclosure.

FIG. 8 illustrates a lens assembly swapping mechanism 803 for changing out optics by rotating new ones into place. This mechanism 803 uses rotations to swap out various lens assemblies 503, 611, and 719 which are installed in barrel 801. The rotations of barrel 801 may be performed with respect to the longitudinal axis of barrel 801, which is also parallel to the optical axes of the lens assemblies 503, 611, and 719. Lens assembly 503 contains convex lens 504, convex lens 506, and convex lens 508 as shown in FIG. 5; lens assembly 611 contains convex lens 612, convex lens 614, and convex lens 616 as shown in FIG. 6; and lens assembly 719 contains concave lens 720, concave lens 722, and concave lens 724 as shown in FIG. 7. In certain embodiments, the lens assembly swapping mechanism may not require physical replacement of lenses in the lens assemblies. Instead, the image size and/or shape may be dynamically modulated by exerting electromagnetic or mechanical effects on special lenses of which the reflective/refractive properties may respond to such effects and cause a change of the magnification ratio. That is, in some embodiments in accordance with the present disclosure, "swapping out" of the optics may be achieved not by physically replacing the optics, but by dynamically changing the optics. For example, a lens capable of modulating its shape under the control of electric, magnetic and/or optic drive effect may be utilized.

In some embodiments, linear translational movements of lenses 504, 506, and 508 inside lens assembly 503 (or lenses 612, 614, and 616 inside lens assembly 611, or lenses 720, 722, and 724 inside lens assembly 719) may be used to change the magnification ratios for the respective lens assembly. When the distance between a pair of lenses among lenses 504, 506, and 508 changes, the magnification ratio of lens assembly 503 may change accordingly.

Figure 9:
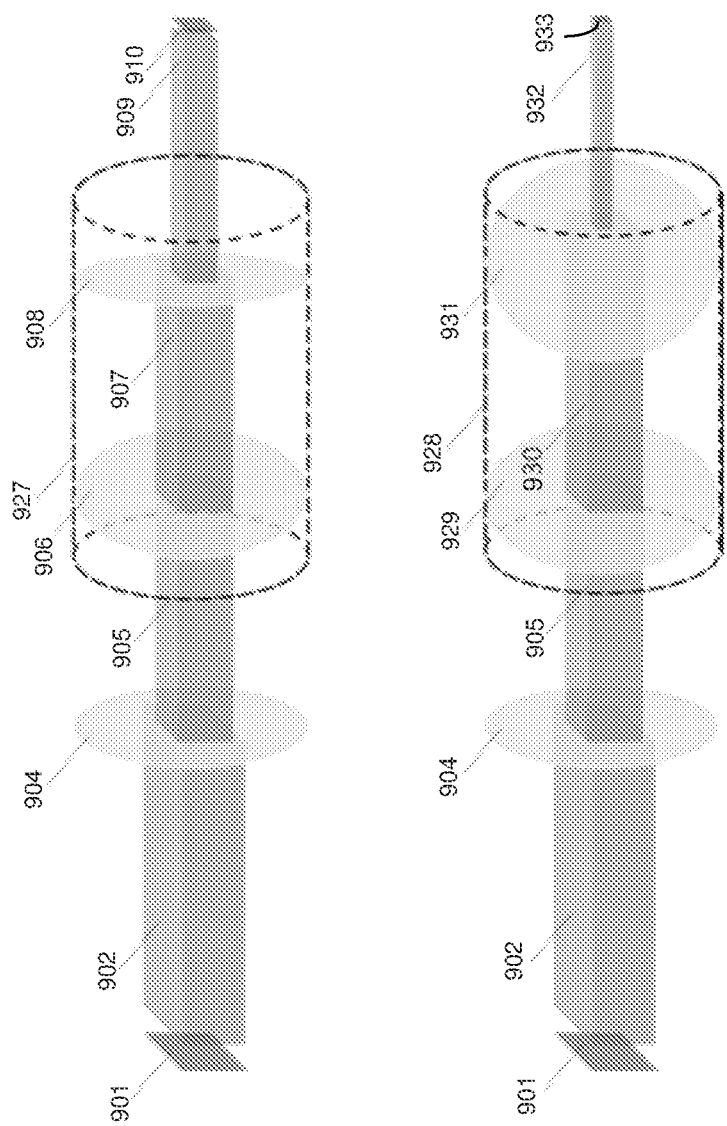
FIG. 9 is a diagram illustrating a swap of second sets of optical lenses in respective lens assemblies in accordance with an embodiment of the present disclosure.

FIG. 9 illustrates a swap of two sets of optical lenses for laser-based powder bed fusion additive manufacturing showing 4× de-magnification changing to 25× de-magnification when a first set of optical lenses 927 and a second set of optical lenses 928 are swapped. Another set of optical lenses including convex lens 904 may be non-detachable or non-swappable. In the example shown in FIG. 9, a beam of 1000 nm laser light 902, in a 5 cm wide and 5 cm tall beam, contains image information in plane 901. A swappable lens assembly 927, which includes a convex lens 906 and a convex lens 908, causes a 4× de-magnification in the laser beam and re-creates the image of plane 901 on plane 910. Beam 902 passes through convex lens 904 to form beam 905 which passes through convex lens 906 to form beam 907 which passes through convex lens 908 to form beam 909 which is incident on the top surface of the powder bed at plane 910 in a 2.5 cm wide and 2.5 cm tall square. The first set of optical lenses 927 is swappable with the second set of optical lenses 928 to allow for different projected intensities on a top surface of the powder bed. When swapped, a convex lens 929 and a convex lens 931 are swapped in to take place of convex lens 906 and convex lens 908, thus converting beam 907 and beam 909 to beam 930 and beam 932 at a new image plane 933, thereby converting the image into a 1 cm wide and 1 cm tall square at plane 933.

Figure 10:
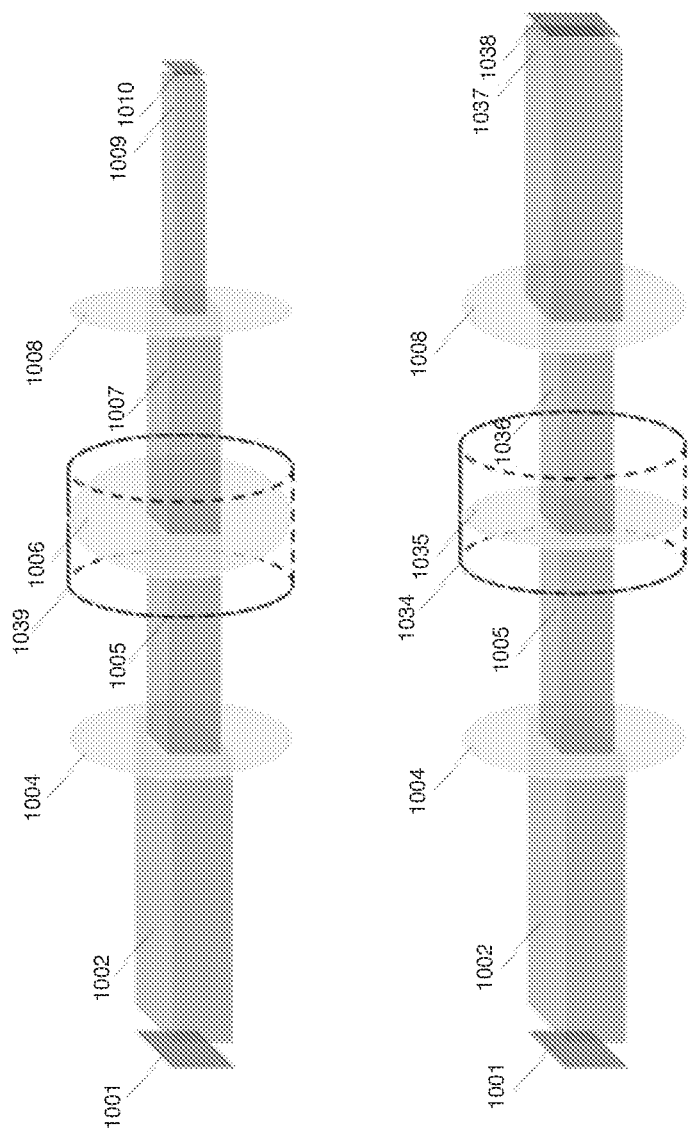
FIG. 10 is another diagram illustrating a swap of second sets of optical lenses in respective lens assemblies in accordance with an embodiment of the present disclosure.

FIG. 10 illustrates a swap of two sets of optical lenses for laser-based powder bed fusion additive manufacturing showing 4× de-magnification changing to 2× magnification when a first set of optical lenses 1039 and a second set of optical lenses 1034 are swapped. Another set of optical lenses including convex lens 1104 and convex lens 1108 may be non-detachable or non-swappable. In the example shown in FIG. 10, a beam of 1000 nm laser light 1002, in a 5 cm wide and 5 cm tall beam, contains image information in plane 1001. A swappable first set of optical lenses 1039, which includes convex lens 1006, causes a 4× de-magnification in the laser beam and re-creates the image of plane 1001 on plane 1010. Beam 1002 passes through convex lens 1004 to form beam 1005 which passes through convex lens 1006 to form beam 1007 which passes through convex lens 1008 to form beam 1009 which is incident on a top surface of the powder bed at plane 1010 in a 2.5 cm wide and 2.5 cm tall square. The second set of optical lenses 1034 is swappable with the first set of optical lenses 1039 to allow for different projected intensities on the top surface of the powder bed. When swapped, concave lens 1035 is swapped in to take place of convex lens 1006, thus converting beam 1007 and beam 1009 to beam 1036 and beam 1037 at a new image plane 1038, thereby resulting in a converted image at plane 1038 of a 10 cm wide and 10 cm tall square.

Figure 11:
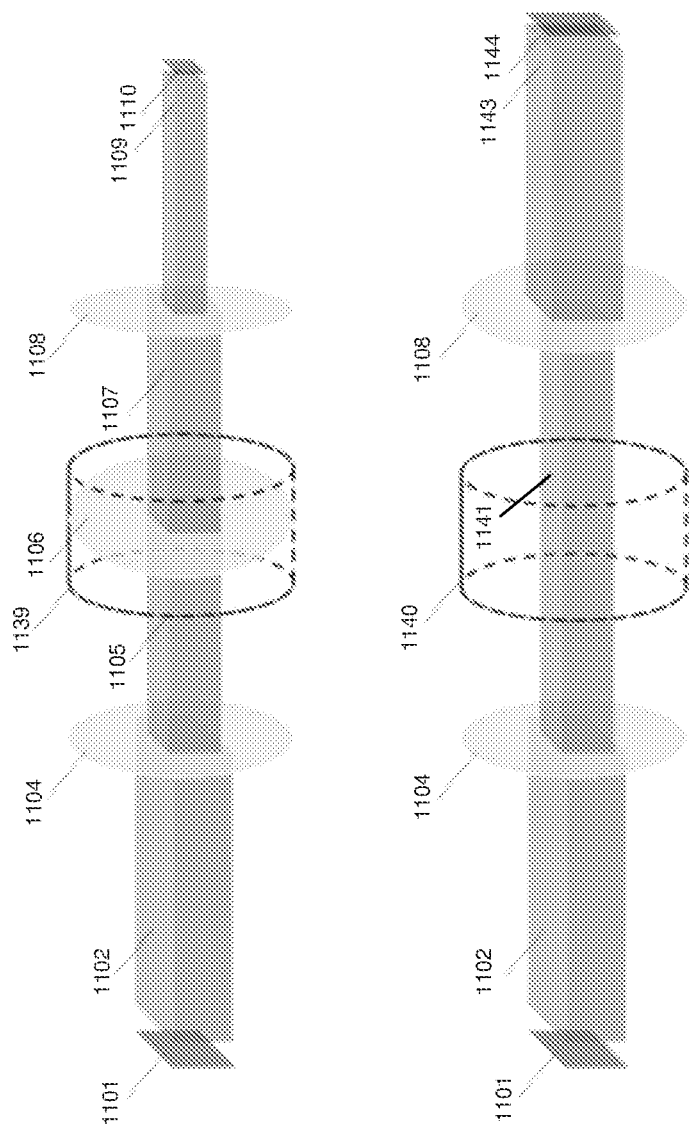
FIG. 11 is a diagram illustrating a removal of a second set of optical lenses in a respective lens assembly in accordance with an embodiment of the present disclosure.

FIG. 11 illustrates a removal of second sets of optical lenses for laser-based powder bed fusion additive manufacturing showing 4× de-magnification changing to 2× magnification when a first set of optical lenses 1139 is removed. Another set of optical lenses including convex lens 1104 and convex lens 1108 may be non-detachable or non-swappable. In the example shown in FIG. 11, a beam of 1000 nm laser light 1102, in a 5 cm wide and 5 cm tall beam, contains image information in plane 1101. A swappable first set of optical lenses 1139, which includes a convex lens 1106, causes a 4× de-magnification in the laser beam and re-creates the image of plane 1101 on plane 1110. Beam 1102 passes through lens 1104 to form beam 1105 which passes through convex lens 1106 to form beam 1107 which passes through convex lens 1108 to form beam 1109 which is incident on the powder bed at plane 1110 in a 2.5 cm wide and 2.5 cm tall square. The first set of optical lenses 1139 is swappable with a second set of optical lenses 1140 to allow for different projected intensities on a top surface of the powder bed. In the example shown in FIG. 11, the second set of optical lenses 1140 contains no lens. When swapped, convex lens 1106 is removed, thus converting beam 1105 and beam 1107 to beam 1141, and beam 1109 to beam 1143 at a new image plane 1144, thereby resulting in a converted image at plane 1144 of a 10 cm wide and 10 cm tall square.

As powder bed fusion additive manufacturing systems grow in speed and size for larger objects, the optical system in laser-based powder bed fusion additive manufacturing systems need to be adjusted to handle resolution requirements. When operating on a light source that is highly divergent and un-collimated, such as with laser lasers, care must be used to ensure that high resolution imaging is maintained. The dynamic optical assembly of the present disclosure is capable of high-resolution image relay operations over large distances and large print surface. A part of the dynamic optical assembly may focus on the translational position control of the optics over the powder bed to maintain high-resolution imaging while directing the laser beam to all possible locations on the powder bed.

The distances between lenses are designed for a specific focal length over a focal plane in an optical system. If the print surface (where an image of the object is formed) coincides with the focal plane of the final optics in the optical system, then a good resolution of the printed object may be obtained. The focal plane may not be a flat plane but with a curvature, and in cases of forming a large object in laser-based powder bed fusion additive manufacturing, some locations on the top surface of the powder bed may lie outside of the focal plane. In some embodiments, a dynamic optical assembly in accordance with the present disclosure may control an imaging distance (or a focal length, or a depth of field) between a source imaging plane and locations on the top surface of the powder bed by adjusting the distance between lens to compensate for the change of the imaging distance due to different locations. The control of the imaging distance may be realized by translational movements and rotations of mirrors and lens mounted on a set of gantries capable of moving along a plane parallel to the top surface of the powder bed (print surface).

Figure 12:
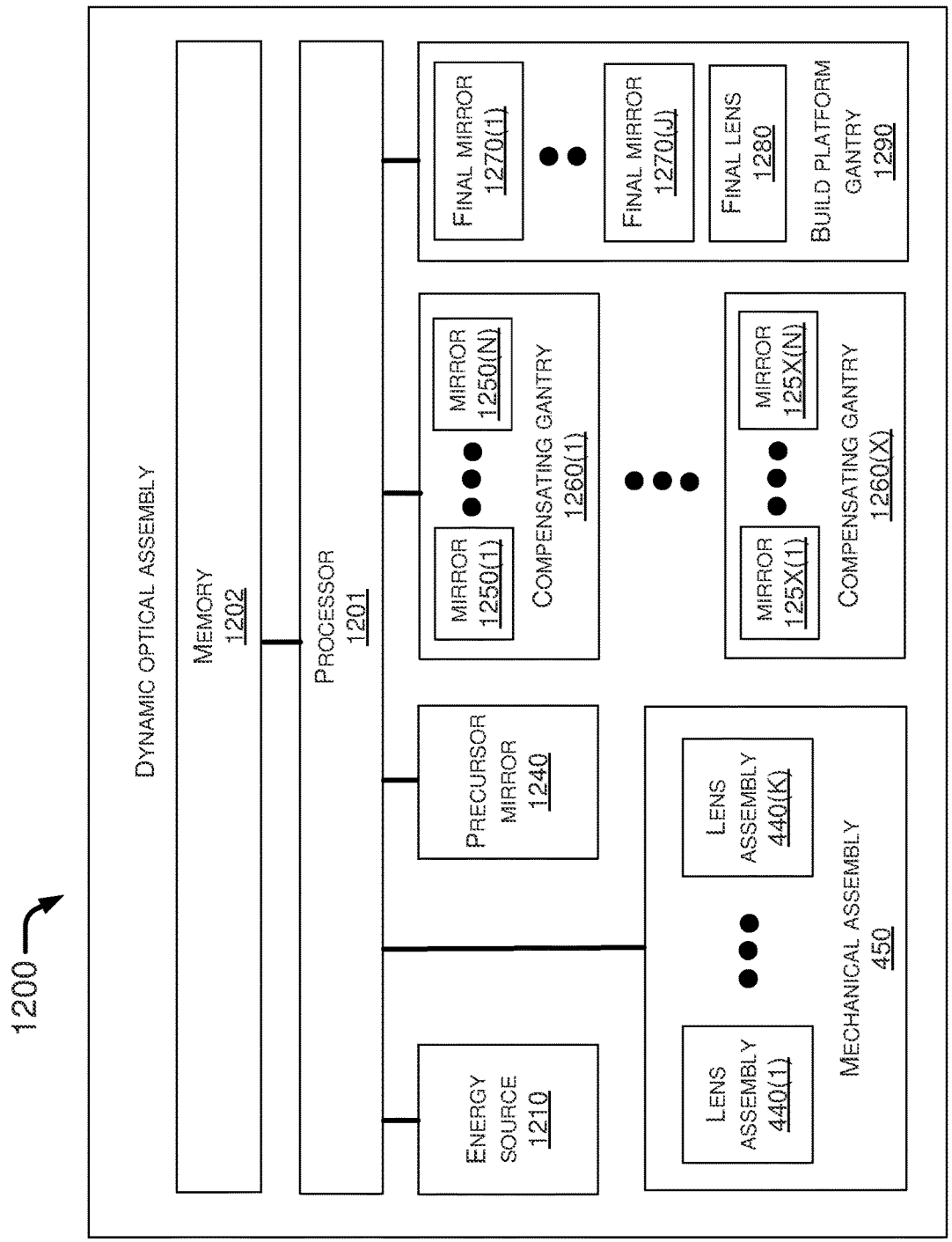
FIG. 12 is a block diagram depicting another example apparatus of a dynamic optical assembly capable of controlling an image distance in accordance with an embodiment of the present disclosure.

FIG. 12 illustrates an example apparatus of dynamic optical assembly 1200 capable of controlling an image distance for high resolution imaging on locations over an entire print surface accordance with an embodiment of the present disclosure. Dynamic optical assembly 1200 may perform various functions related to techniques, methods and systems described herein, including those described below with respect to process 1700. Dynamic optical assembly 1200 may be installed in, equipped on, connected to or otherwise implemented in a laser-based powder bed fusion additive manufacturing system as described above with respect to FIGS. 1A-3B to effect various embodiments in accordance with the present disclosure. Dynamic optical assembly 1200 may include at least some of the components illustrated in FIG. 12.

In some embodiments, dynamic optical assembly 1200 may include a precursor mirror 1240, at least one compensating gantry, build platform gantry 1290. For illustrative purpose and without limitation, the at least one compensating gantry is shown in FIG. 12 as a set of compensating gantries 1260(1)-1260(X), with X being a positive integer greater than 0. The compensating gantries 1260(1)-1260(X) may include sets of mirrors 1250(1)-1250(N), 1251(1)-1251(N), . . . , 125X(1)-125X(N), with N a positive integer. Each set of the mirrors 1250(1)-1250(N), 1251(1)-1251(N), . . . , 125X(1)-125X(N) may be mounted on the respective compensating gantries 1260(1)-1260(X). In some embodiments, at least one set of mirrors 1250(1)-1250(N) may be mounted on the one of the compensating gantries 1260(1)-1260(X). Build platform gantry 1290 may include a final set of mirrors 1270(1)-1270(J), with J a positive integer. In some embodiments, build platform gantry 1290 may further include final lens 1280. Build platform gantry 1290 may be mounted at a vertical distance above the print surface and the compensating gantries 1260(1)-1260(X) may be mounted at a horizontal distance next to build platform gantry 1290. Precursor mirror 1240 may reflect off an incident light containing an image at a precursor image plane towards compensating gantries. Sets of mirrors 1250(1)-1250(N), 1251(1)-1251(N), . . . , 125X(1)-125X(N) on the compensation gantries 1260(1)-1260(X) may be capable of translational movements and rotations so as to direct the incident light received from precursor mirror 1240 towards build platform gantry 1290. Final set of mirrors 1270(1)-1270(J) on build platform gantry 1290 may be capable of translational movements and rotations so as to direct the incident light received from compensating gantries 1260(1)-1260(X) towards the print surface. The translational movements of sets of mirrors 1250(1)-1250(N), 1251(1)-1251(N), . . . , 125X(1)-125X(N) on compensating gantries 1260(1)-1260(X) and final set of mirrors 1270(1)-1270(J) on build platform gantry 1290 may serve to control a constant image distance between lenses for maintaining an image resolution during the image relay from the precursor image plane and the print surface. The rotations of sets of mirrors 1250(1)-1250(N), 1251(1)-1251 (N), . . . , 125X(1)-125X(N) on compensating gantries 1260(1)-1260(X) and final set of mirrors 1270(1)-1270(J) on build platform gantry 1290 may serve to direct the incident light to various locations on the print surface.

In some embodiments, dynamic optical assembly 1200 may include one compensating gantry 1260(1) mounted with one mirror 1250(1). Dynamic optical assembly 1200 may further include precursor mirror 1240 and build platform gantry 1290 mounted with one final mirror 1270(1) and final lens 1280. Precursor mirror 1240, directing the incident light from the precursor image plane, may be incapable of rotations and translational movements. Precursor mirror 1240, directing the incident light from the precursor image plane, may direct an incident light towards mirror 1250(1) on compensating gantry 1260(1). Mirror 1250(1) may be capable of a rotation in one degree of freedom and a translational movement in one degree of freedom. Mirror 1250(1) may further direct light towards final mirror 1270(1) on build platform gantry 1290. Final mirror 1270(1) may be capable of rotations in two degrees of freedom and translational movements in two degree of freedom so as to direct the incident light passing through final lens 1280 to all locations on the print surface. Final lens 1280 may be fixed below relative to final mirror 1270(1) and moves synchronously with final mirror 1270(1).

In some embodiments, dynamic optical assembly 1200 may further include a processor 1201 and a memory 1202 to facilitate controlling of positions and rotations of sets of mirrors 1250(1)-1250(N), 1251(1)-1251(N), . . . , 125X(1)-125X(N) on compensating gantries 1260(1)-1260(X) and final mirror 1270 on build platform gantry 1290. Memory 1202 storing instructions or programs for configuring relative positions and angles of sets of mirrors 1250(1)-1250(N), 1251(1)-1251(N), . . . , 125X(1)-125X(N) and final set of mirrors 1270(1) 1270(J) to maintain a constant image distance across the entire print surface.

In some embodiments, dynamic optical assembly 1200 may further include a plurality of lens assemblies 440(1)-440(K) and a mechanical assembly 450 of apparatus 400 to be able to change magnification ratios on-the-fly for different powdered materials. Lens assemblies 440(1)-440(K) may include first sets of optical lenses 420(1)-420(K) and second sets of optical lenses 430(1)-430(K) respectively as in apparatus 400.

Figure 13:
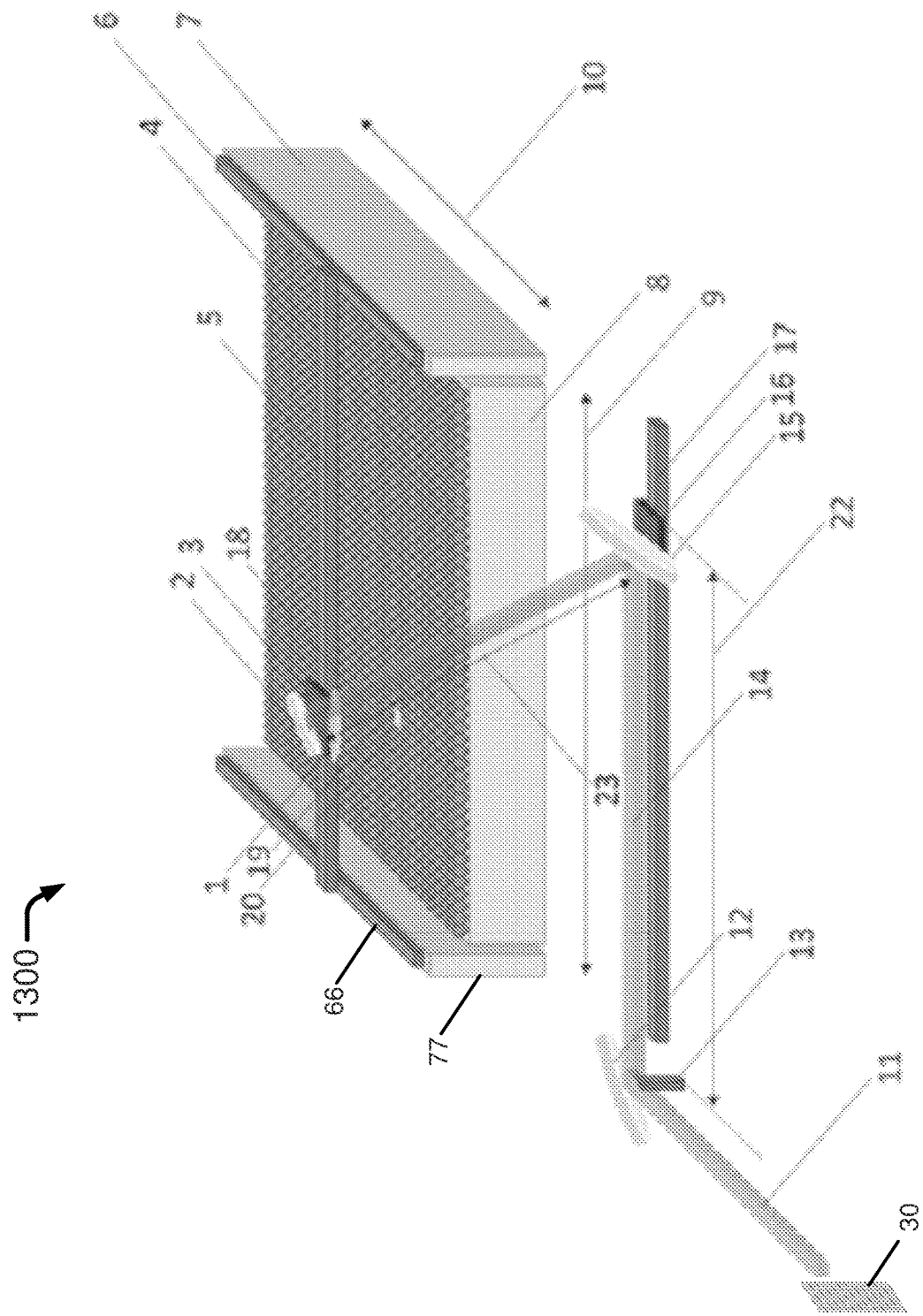
FIG. 13 is an example implementation of a dynamic optical assembly capable of controlling an image distance in accordance with an embodiment of the present disclosure.

FIG. 13 illustrates an example scenario 1300 as in embodiments described above in accordance with the present disclosure. Scenario 1300 illustrates a near-point print as to how compensating gantry and build platform gantry may compensate for a change of the imaging location. In FIG. 13, build platform gantry is made of rail 5, rail 6, and rail 66. Final mirror 2 is mounted on podium 3 and supports fixed final lens 1. Final mirror 2 is capable of rotations in two degrees of freedom. Build platform gantry (rail 5, rail 6, and rail 66) is mounted above a powder bed 4, and is capable of a translational motion in the x-direction 9 on rail 5 and in the y-direction 10 on rail 6. Y-directional rail 6 and rail 66 are mounted on wall 7 and wall 77 respectively, which sandwich a build platform 8 therebetween. Build platform 8 is capable of a vertical translational motion up and down. A patterned beam of light 11, which includes a 4 cm×4 cm beam of 1000 nm light containing 18.75 kW of power, may be emanated from an energy source (e.g., semiconductor laser), may contain image information in a precursor image plane 30, and may then reflect off of precursor mirror 12 mounted on post 13 which is incapable of movements and rotations. The beam of light 14 leaving the precursor mirror 12 reflects a second time off of mirror 15 which is mounted to podium 16 on compensating gantry platform of rail 17, and capable of rotation in one axis, and horizontal translation in the x-direction 9 on rail 17. The beam of light 18 leaving mirror 15 reflects off of final mirror 2 passes through final lens 1 which focuses the light in beam 19 to a 1 cm×1 cm square achieving intensities of $$300 \frac{kW}{cm^2}$$

at the top surface of powder bed 4 (print surface) to melt a pattern in a printed image 20. The current position of podium 16 is such that the distance the light travels is constant and that the distance 22 of 40 cm between precursor mirror 12 and mirror 15 plus the distance 23 of 60 cm between mirror 15 and final mirror 2 is at a constant value (100 cm) for every x and y position of podium 3 and corresponding x-position of podium 16. It is noteworthy that the dimensions and values referenced herein are for illustrative purposes and without limitation. That is, the scope of the present disclosure is limited to the specific example shown and described in FIG. 13.

Figure 14:
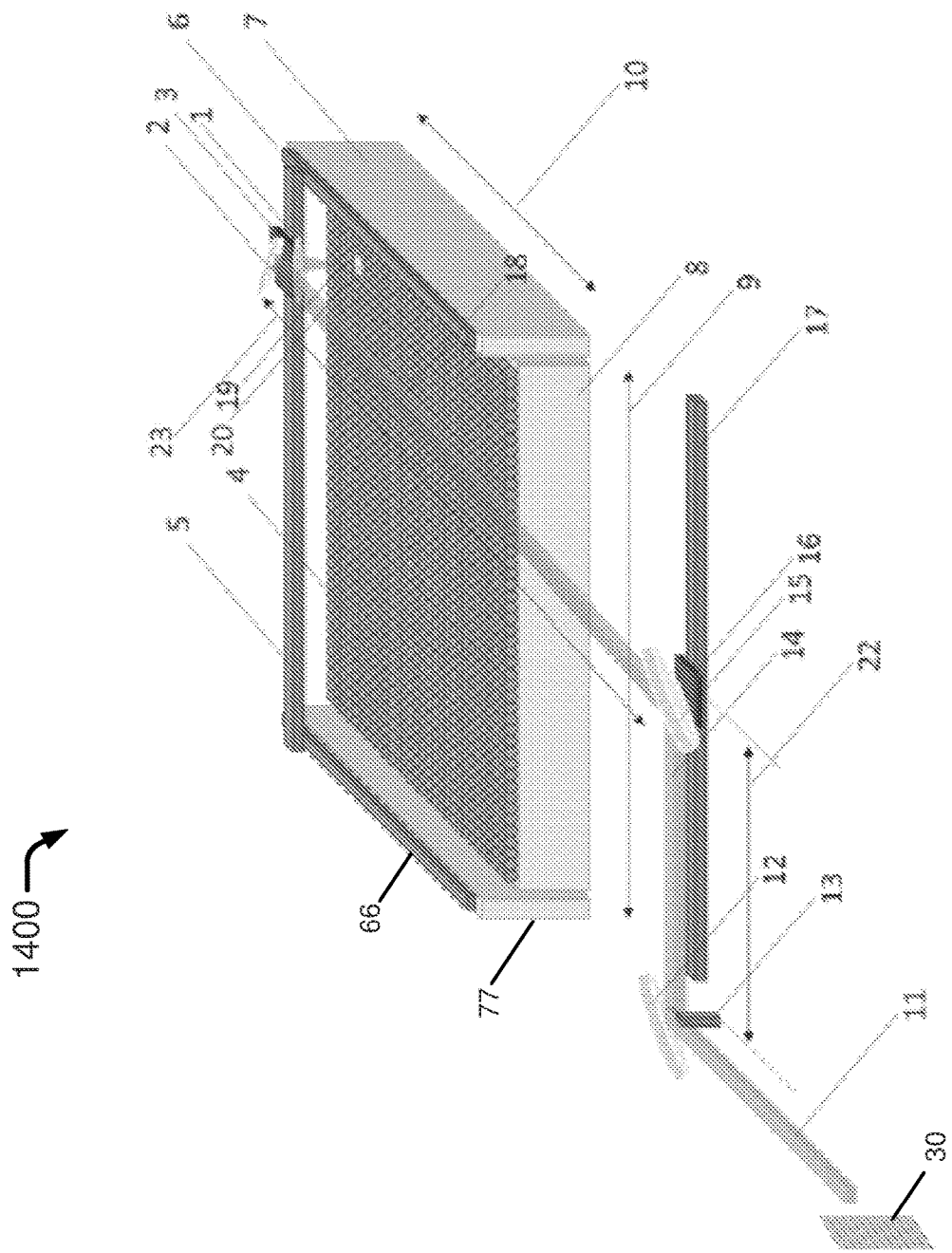
FIG. 14 is another example implementation of a dynamic optical assembly capable of controlling an image distance in accordance with an embodiment of the present disclosure.

FIG. 14 illustrates an example scenario 1400 as in embodiments described above in accordance with the present disclosure. Scenario 1400 illustrates a fart-point print as to how compensating gantry and build platform gantry may compensate for a change of the imaging location. In FIG. 14, build platform gantry is made of rail 5, rail 6, and rail 66. Final mirror 2 is mounted on podium 3 also supporting fixed final lens 1. Final mirror 2 is capable of rotations in two degrees of freedom. Build platform gantry (rail 5, rail 6, and rail 66) is mounted above a powder bed 4, and is capable of translational motion in the x-direction 9 on rail 5 and in the y-direction 10 on rail 6. Y-directional rail 6 and rail 66 are mounted on wall 7 and wall 77 respectively, which sandwich the main build platform 8 therebetween. Build platform 8 is capable of relative translational motion up and down. A patterned beam of light 11, which includes a 4 cm×4 cm beam of 1000 nm light containing 18.75 kW of power, may emanate from the additive manufacturing optical system, may contain image information in a precursor image plane 30, and may reflect off of precursor mirror 12 mounted on post 13 which is incapable of movements and rotations. The beam of light 14 leaving precursor mirror 12 reflects a second time off of mirror 15 which is mounted to podium 16, and capable of rotation in one axis, and horizontal translation in the x-direction 9 on compensating gantry of rail 17. The beam of light 18 leaving mirror 15 reflects off of final mirror 2 passes through final lens 1 which focuses the light in beam 19 to a 1 cm×1 cm square achieving intensities of $$300\frac{kW}{cm^2}$$

at the top surface of powder bed 4 (print surface) to melt a pattern in a printed image 20. The current position of the podium 16 is such that the distance the light travels is constant and that the distance 22 of 20 cm between precursor mirror 12 and mirror 15 plus the distance 23 of 80 cm between mirror 15 and final mirror 2 is at a constant value (100 cm) for every x and y position of podium 3 and corresponding x-position of podium 16. It is noteworthy that the dimensions and values referenced herein are for illustrative purposes and without limitation. That is, the scope of the present disclosure is limited to the specific example shown and described in FIG. 14.

Figure 15:
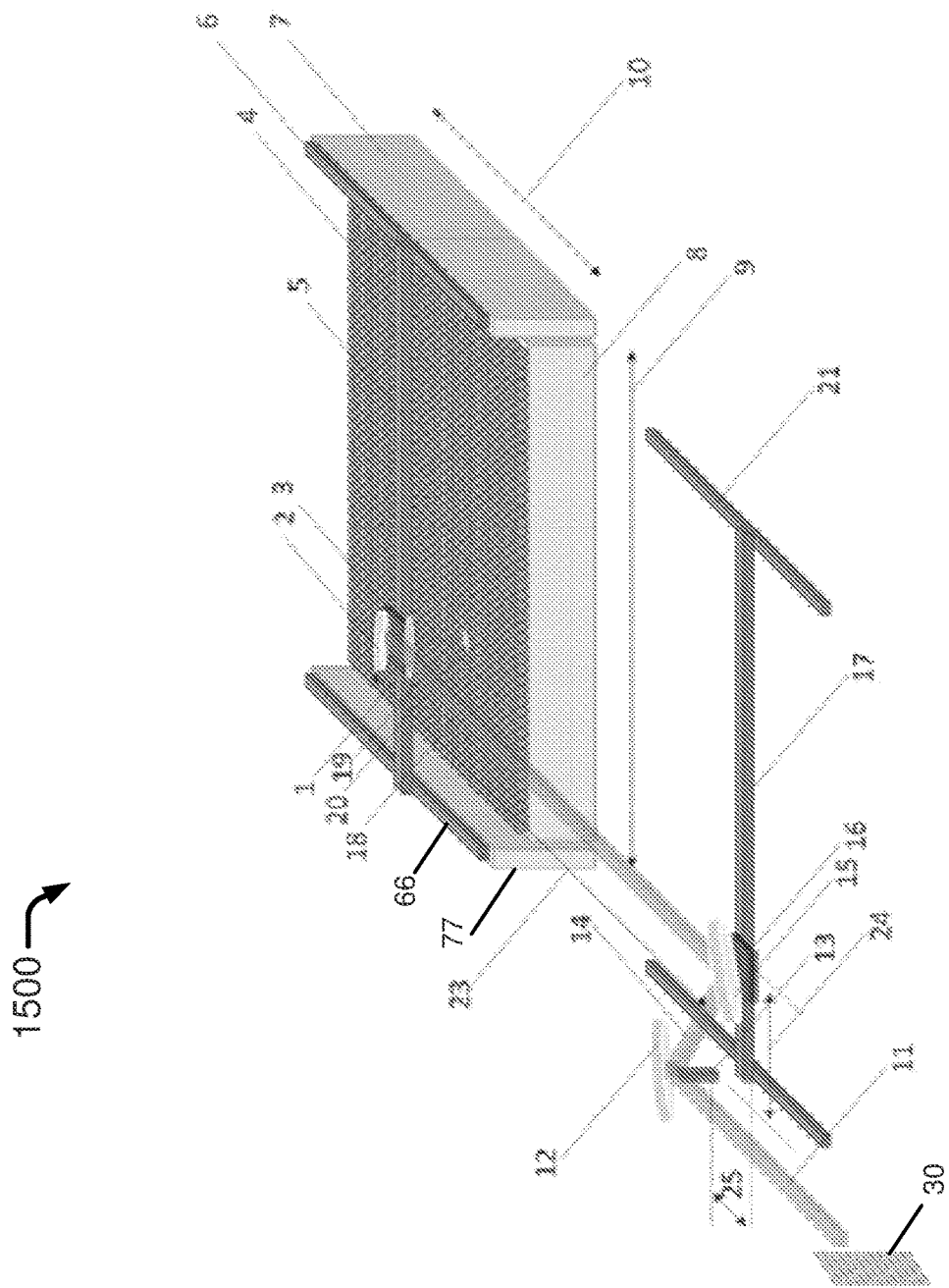
FIG. 15 is another example implementation of a dynamic optical assembly capable of controlling an image distance in accordance with an embodiment of the present disclosure.

FIG. 15 illustrates an example scenario 1500 as in embodiments described above in accordance with the present disclosure. Scenario 1500 illustrates a near-point print as to how compensating gantry and build platform gantry may compensate for a change of the imaging location. In FIG. 15, build platform gantry is made of rail 5, rail 6, and rail 66. Final mirror 2 is mounted on podium 3 also supporting fixed final lens 1. Final mirror 2 is capable of a rotation in one degree of freedom. Build platform gantry (rail 5, rail 6, and rail 66) is mounted above a powder bed 4, and is capable of translational motion in the x-direction 9 on rail 5 and in the y-direction 10 on rail 6. Y-directional rail 6 and rail 66 are mounted on wall 7 and wall 77, which sandwich the main build platform 8 therebetween. Build platform 8 is capable of relative translational motion up and down. A patterned beam of light 11, which includes a 4 cm×4 cm beam of 1000 nm light containing 18.75 kW of power, may emanate from the additive manufacturing optical system, may contain image information in a precursor image plane 30, and may reflect off of precursor mirror 12 mounted on post 13 which is capable of rotation in one degree of freedom. The beam of light 14 leaving precursor mirror 12 reflects a second time off of mirror 15 which is mounted to podium 16, and capable of rotation in one axis, horizontal translation in the x-direction 9 on compensating gantry of rail 17, as well as translation in the y-direction 10 on rail 21. The beam of light 18 leaving mirror 15 reflects off of final mirror 2 passes through final lens 1 which focuses the light in beam 19 to a 1 cm×1 cm square achieving intensities of $$300\frac{kW}{cm^2}$$

at the top surface of powder bed 4 (print surface) to melt a pattern in a printed image 20. The current position of the podium 16 is such that the distance the light travels is constant and that the square root of the square of the distance 24 in the x-direction 9 of 10 cm between precursor mirror 12 and mirror 15 plus the square of distance 25 in the y-direction 10 of 10 cm ($\sqrt{10^2+10^2}$=14.14 cm) plus the distance 23 of 85.86 cm between mirror 15 and mirror 2 is at a constant value (100 cm) for every x and y position of podium 3 and corresponding x and y positions of podium 16. It is noteworthy that the dimensions and values referenced herein are for illustrative purposes and without limitation. That is, the scope of the present disclosure is limited to the specific example shown and described in FIG. 15.

Figure 16:
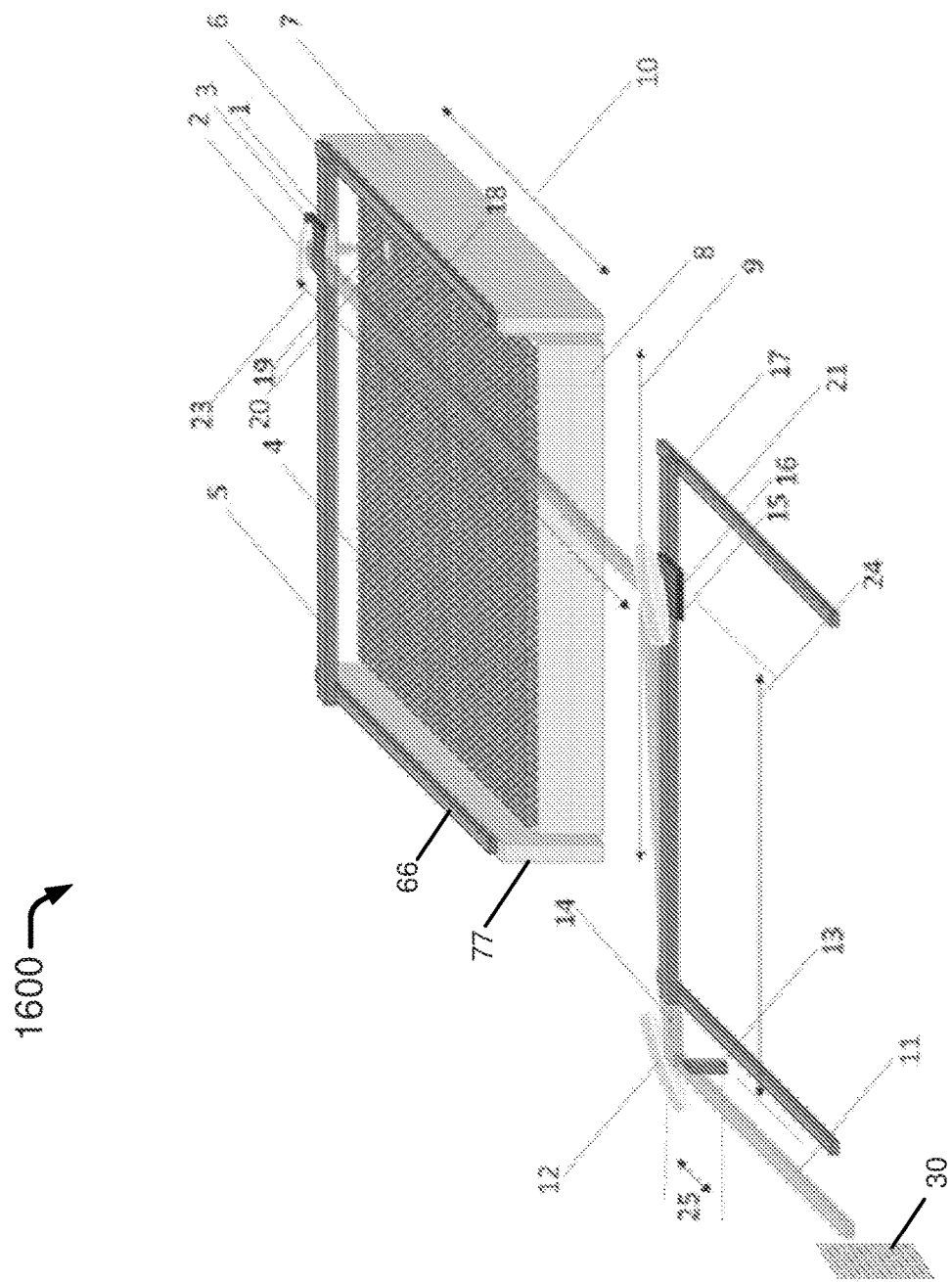
FIG. 16 is another example implementation of a dynamic optical assembly capable of controlling an image distance in accordance with an embodiment of the present disclosure.

FIG. 16 illustrates an example scenario 1600 as in embodiments described above in accordance with the present disclosure. Scenario 1600 illustrates a far-point print as to how compensating gantry and build platform gantry may compensate for a change of the imaging location. In FIG. 16, build platform gantry is made of rail 5, rail 6, and rail 66. Final mirror 2 is capable of a rotation in one degree of freedom. Build platform gantry (rail 5, rail 6, and rail 66) is mounted above a powder bed 4, and is capable of translational motion in the x-direction 9 on rail 5 and in the y-direction 10 on rail 6. Y-directional rail 6 and rail 66 are mounted on wall 7 and wall 77, which sandwich the main build platform 8 therebetween. Build platform 8 is capable of relative translational motion up and down. A patterned beam of light 11, which includes a 4 cm×4 cm beam of 1000 nm light containing 18.75 kW of power, may emanate from the additive manufacturing optical system, may contain image information in a precursor image plane 30, and may reflect off of precursor mirror 12 mounted on post 13 which is capable of rotation in one degree of freedom. The beam of light 14 leaving precursor mirror 12 reflects a second time off of mirror 15 which is mounted to podium 16, and capable of rotation in one axis, horizontal translation in the x-direction 9 on compensating gantry of rail 17, as well as translation in the y-direction 10 on rail 21. The beam of light 18 leaving mirror 15 reflects off of final mirror 2 passes through final lens 1 which focuses the light in beam 19 to a 1 cm×1 cm square achieving intensities of $$300\frac{kW}{cm^2}$$

at the top surface of powder bed 4 (print surface) to melt a pattern in a printed image 20. The current position of podium 16 is such that the distance the light has to travel is constant and that the square root of the square of the distance 24 in the x-direction 9 of 45 cm between precursor mirror 12 and mirror 15 plus the square of distance 25 in the y-direction 10 of 10 cm ($\sqrt{10^2+45^2}$=46.1 cm) plus the distance 23 of 53.9 cm between mirror 15 and final mirror 2 is at a constant value (100 cm) for every x and y position of podium 3 and corresponding x and y positions of podium 16. It is noteworthy that the dimensions and values referenced herein are for illustrative purposes and without limitation. That is, the scope of the present disclosure is limited to the specific example shown and described in FIG. 16.

Figure 17:
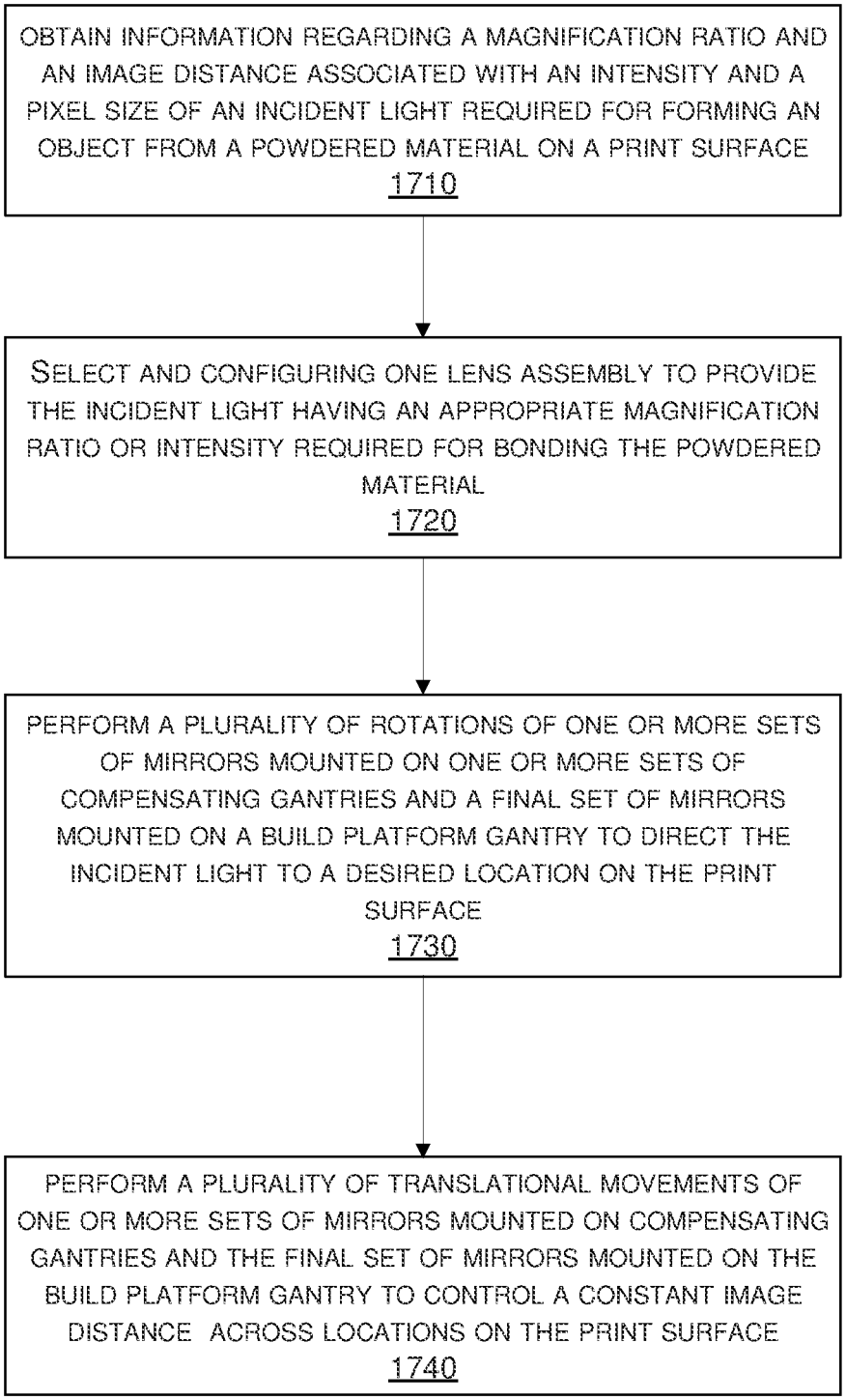
FIG. 17 is a block diagram illustrating process steps of performing a laser-based powder bed fusion additive print job in accordance with an embodiment of the present disclosure.

FIG. 17 illustrates an example process 1700 in accordance with the present disclosure. Process 1700 may be utilized to print an object in a laser-based powder bed fusion additive manufacturing system in accordance with the present disclosure. Process 1700 may include one or more operations, actions, or functions shown as blocks such as 1710, 1720, 1730, and 1740. Although illustrated as discrete blocks, various blocks of process 1700 may be divided into additional blocks, combined into fewer blocks, or eliminated, depending on the desired implementation, and may be performed or otherwise carried out in an order different from that shown in FIG. 17. Process 1700 may be implemented by a combination of dynamic optical assembly 400 and dynamic optical assembly 1200. For illustrative purposes and without limiting the scope of process 1700, the following description of process 1700 is provided in the context of dynamic optical assembly 1200. Process 1700 may begin with block 1710.

At 1710, process 1700 may involve processor 1201 of dynamic optical assembly 1200 obtaining or otherwise determining information of intensity of light (or energy) required for a powdered material to be bonded in a powder bed fusion additive manufacturing system as described in FIGS. 1A-3B. Process 1700 may further involve processor 1201 obtaining or otherwise determining a minimum resolution (a pixel size of an incident light) for an object to be printed in the powder bed fusion additive manufacturing system. According to the intensity and resolution requirements, process 1700 may involve processor 1201 determining a magnification ratio of the incident light containing an image information and an image distance of dynamic optical assembly 1200 associated with the intensity and resolution requirements respectively. The magnification ratio may transfer a first size of the image at a precursor image plane to a second size of the image at the print surface (top surface of a powder bed). The incident light may be originated from energy source 1210 and passes through the precursor image plane at which the image information may be created. Process 1700 may involve memory 1202 of dynamic optical assembly 1200 storing geometrical data of the object, positional and rotational control data of precursor mirror 1240, sets of mirrors 1250(1)-1250(N), 1251(1)-1251(N), . . . , 125X(1)-125X(N), and final set of mirrors 1270(1)-1270(J) in each successive step of powder bed fusion additive manufacturing. Process 1700 may proceed from 1710 to 1720.

At 1720, process 1700 may involve processor 1201 configuring mechanical assembly 450 and one or more of lens assemblies 440(1)-440(K) of dynamic optical assembly 1200 to achieve the magnification ratio obtained at 1710 suitable for the powdered material. The configuring of mechanical assembly 450 and one of lens assemblies 440(1)-440(K) may involve a rotation of mechanical assembly 450, a swap of second sets of optical lenses 430(1)-430(K), or a removal of a second set of optical lenses 430(1)-430(K). Process 1700 may proceed from 1720 to 1730.

At 1730, process 1700 may involve processor 1201 controlling precursor mirror 1240, sets of mirrors 1250(1)-1250(N), 1251(1)-1251(N), . . . , 125X(1)-125X(N), final set of mirrors 1270(1)-1270(J) of dynamic optical assembly 1200 to perform a plurality of rotations to direct the incident light from the precursor image plane to the print surface at a desired location on the print surface (e.g., top surface of a powder bed) in each successive step of powder bed fusion additive manufacturing. Process 1700 may proceed from 1730 to 1740.

At 1740, process 1700 may involve processor 1201 controlling sets of mirrors 1250(1)-1250(N), 1251(1)-1251(N), . . . , 125X(1)-125X(N), final set of mirrors 1270(1)-1270(J) of dynamic optical assembly 1200 to perform a plurality of translational movements to maintain a constant image distance from the precursor image plane to every location of the print surface (e.g., top surface of a powder bed) in each successive step of powder bed fusion additive manufacturing. At 1730 and 1740, processor 1201 may control the vertical motion of the powder bed to maintain a fixed separation with final lens 1280.

Moreover, process 1700 may involve processor 1201 performing steps 1730 and 1740 in parallel or in reverse order. Alternatively, process 1700 may involve processor 1201 performing either step 1730 or step 1740 only, or none of steps 1730 and 1740.

Figure 18:
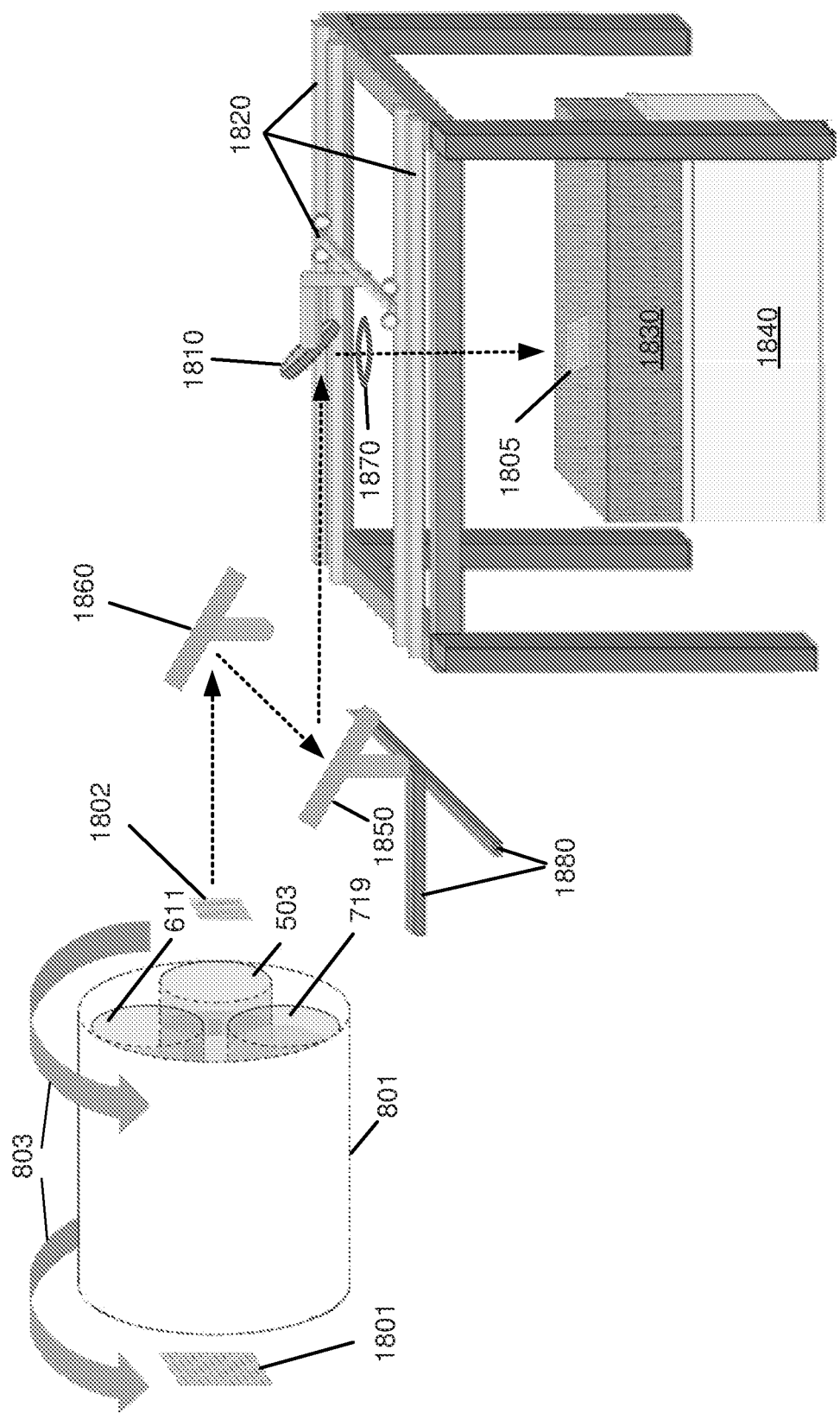
FIG. 18 is an example implementation of a dynamic optical assembly capable of selecting a magnification ratio and controlling an image distance in accordance with an embodiment of the present disclosure.

FIG. 18 illustrates an example implementation of dynamic optical assembly 1200 according to process 1700 in accordance with the present disclosure. A layer of a powdered material is dispensed on a top surface of a powder bed 1830 supported by a build platform 1840. Source image 1801 of an incident light located at a precursor image plane is incident upon lens assembly 503 in barrel 801. Lens assembly 503 may be configured by a rotation 803 of barrel 801 that effect a swap of a second set of optical lenses (e.g. lenses 603), a removal of a second set of optical lenses, use of dynamic lenses that change shape, electronic lens swapping, beam redirect systems, electro-optically controlled refractive beam steering devices, or a combination thereof, to have a suitable magnification ratio for the powdered material. The beam containing image information of 1801 is incident on precursor mirror 1860 and is directed to mirror 1850 mounted on compensating gantry 1880 where it reflects off mirror 1850 and then is incident on final mirror 1810 mounted on build platform gantry 1820. Final mirror 1810 directs the beam containing image information 1801 through a final lens 1870 toward a top surface of a powder bed 1830 and object image 1801 is recreated and magnified in image plane 1805 which may be formed thereon. Alternatively, a transmissive beam steering device can be used in place of 1810 to direct the beam around the build platform. Object image 1805 may be of a size different than source image 1801 after passing through lens assembly 503 and traversing the optical path from precursor mirror 1860 to the top surface of powder bed 1830 and may be modified according to the magnification ratios of lens assembly 503 and/or final lens 1870. The powdered material on powder bed 1830 may melt to form a shape of object image 1805. Build platform gantry 1820 then moves to a next location until designated locations on the top surface of powder bed 1830 are bonded for that layer. A new layer of the powdered material is dispensed again and the build platform 1840 may move down a distance equal to the thickness of the layer of the powdered material to keep a constant distance to the build platform gantry 1820. The cycle starts for the new layer in continuing the additive printing process.

In the above disclosure, reference has been made to the accompanying drawings, which form a part hereof, and in which is shown by way of illustration specific implementations in which the present disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, apparatuses, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media may be any available media that may be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the present disclosure may comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which may be used to store desired program code means in the form of computer-executable instructions or data structures and which may be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or any combination of hardwired or wireless) to a computer, the computer properly views the connection as a transmission medium. Transmissions media may include a network and/or data links, which may be used to carry desired program code means in the form of computer-executable instructions or data structures and which may be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Further, where appropriate, functions described herein may be performed in one or more of: hardware, software, firmware, digital components, or analog components. For example, one or more application specific integrated circuits (ASICs) may be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the present disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail may be made therein without departing from the spirit and scope of the present disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure.

The invention claimed is:

1. An apparatus, comprising:
   one or more lens assemblies;
   a build platform gantry;
   a build platform positioned under the build platform gantry;
   a plurality of mirrors comprising a precursor mirror, an intermediary mirror, and a final mirror configured to direct incident light emanating from the one or more lens assemblies to a specific location on the build platform;
   an energy patterning unit configured to provide a two-dimensional patterned beam;
   an image relay configured to receive and direct the two-dimensional patterned beam to the one or more lens assemblies; and
   wherein the final mirror is mounted on a first podium of the build platform gantry which is movable in both of a first direction and a second direction perpendicular to the first direction and rotatable about a first axis,
   wherein the intermediary mirror is mounted on a second podium of a compensation gantry which is translatable only in the first direction and rotatable about at least a second axis,
   wherein the incident light travels a first distance from the precursor mirror to the intermediary mirror,
   wherein the incident light travels a second distance from the intermediary mirror to the final mirror, and
   wherein the build platform gantry is configured to translate the first podium in the first direction and in the second direction and to rotate the final mirror about the first axis in order to direct the two-dimensional patterned beam at different areas of the build platform to fabricate a part;
   wherein the compensation gantry is configured to translate the second podium only in the first direction and rotate the intermediary mirror about the second axis to maintain a constant value of a sum of the first distance and the second distance for every position of the first podium and a corresponding position of the second podium.

2. The apparatus of claim 1, wherein the one or more lens assemblies comprise a plurality of first sets of optical lenses and a plurality of second sets of optical lenses respectively, and wherein the plurality of second second sets of optical lenses are swappable among the one or more lens assemblies.

3. The apparatus of claim 2, wherein each lens assembly of the one or more lens assemblies is associated with a magnification ratio and comprises a respective set of first sets of optical lenses and a respective set of second sets of optical lenses, and wherein the respective set of the first sets of optical lenses and the respective set of the second sets of the optical lens in each lens assembly of the lens assemblies are aligned in an optical axis of the respective lens assembly to allow the incident light to pass through.

4. The apparatus of claim 3, further comprising a mechanical assembly that is operable to perform a removal of one of the second sets of optical lenses in a corresponding lens assembly of the one or more lens assemblies, and wherein the removal of the one of the second sets of optical lenses causes a change of a magnification ratio associated with the corresponding lens assembly.

5. The apparatus of claim 4, wherein the mechanical assembly is operable to perform a swap among the second sets of optical lenses in the lens assemblies, wherein the swap among the second sets of optical lenses causes a change of a magnification ratio associated with a lens assembly in which a corresponding set of the second sets of optical lenses is swapped.

6. The apparatus of claim 4, wherein the mechanical assembly is operable to rotate the lens assemblies as a whole, clockwise or counterclockwise with respect to a longitudinal axis of the lens assemblies, in such a way that one of the one or more lens assemblies is selected to allow the incident light to pass through.

7. The apparatus of claim 1, further comprising an energy source capable of providing the incident light of sufficient energy to bond a powdered material on the build platform.

8. An apparatus, comprising:
a precursor mirror arranged to receive and direct an incident light;
one or more compensating gantries comprising one or more sets of mirrors respectively arranged to receive and direct the incident light from the precursor mirror;
a build platform gantry comprising a final set of mirrors arranged to receive and direct the incident light from the one or more compensating gantries onto a location of a top surface of a powder bed supported by a build platform;
one or more lens assemblies configured to emit the incident light onto the precursor mirror; and
an energy patterning unit configured to provide a two-dimensional patterned beam;
an image relay configured to receive and direct the two-dimensional patterned beam to the one or more lens assemblies; and
a rejected energy handling unit configured to direct rejected beam energy to the energy patterning unit, the rejected energy handling unit also comprising a beam dump configured to absorb unused beam energy not used in the energy patterning unit,
wherein the one or more sets of mirrors comprise an intermediary mirror,
wherein the final set of mirrors comprises a final mirror,
wherein the final mirror is mounted on a first podium of the build platform gantry which is movable in both of a first direction and a second direction perpendicular to the first direction,
wherein the intermediary mirror is mounted on a second podium of the one or more compensating gantries which is movable in both of the first direction and the second direction,
wherein the incident light travels a first distance from the precursor mirror to the intermediary mirror,
wherein the incident light travels a second distance from the intermediary mirror to the final mirror, and
wherein the build platform gantry and the one or more compensating gantries are configured to move the first podium and the second podium to maintain a constant value of a sum of the first distance and the second distance for every position of the first podium and a corresponding position of the second podium.

9. The apparatus of claim 8, wherein the build platform gantry is mounted at a vertical height above the top surface of the powder bed, and wherein the one or more compensating gantries are mounted next to the build platform gantry.

10. The apparatus of claim 8, wherein the final set of mirrors mounted on the build platform gantry are capable of a rotation of two degrees of freedom.

11. The apparatus of claim 8, wherein the final set of mirrors mounted on the build platform gantry are capable of a rotation of one degree of freedom.

12. The apparatus of claim 8, wherein the build platform gantry further comprises a final lens that is incapable of a rotation and moves synchronously with the final mirror of the final set of mirrors.

13. The apparatus of claim 8, wherein the one or more sets of mirrors mounted on the one or more compensating gantries are capable of a rotation of two degrees of freedom.

14. The apparatus of claim 8, wherein the one or more sets of mirrors of the one or more compensating gantries are capable of a rotation of one degree of freedom.

15. The apparatus of claim 8, wherein the precursor mirror is capable of a rotation of one degree of freedom and a translational movement of one degree of freedom.

16. The apparatus of claim 8, wherein the precursor mirror is incapable of a rotation and a translational movement.

17. The apparatus of claim 8, further comprising:
an energy source capable of providing the incident light of sufficient energy to bond a powdered material.

18. The apparatus of claim 8, wherein the one or more lens assemblies include a plurality of lens assemblies and a mechanical assembly is operable to rotate the plurality of lens assemblies as a whole, clockwise or counterclockwise with respect to a longitudinal axis of the plurality of lens assemblies, such that one lens assembly of the plurality of lens assemblies is selected to allow the incident light to pass through.

19. The apparatus of claim 8, further comprising:
a processor executing a set of instructions regarding directing the incident light from the precursor mirror to the location of the top surface of the powder bed; and
a memory storing of the set of instructions, wherein executions of the set of instructions by the processor causes the processor to perform operations comprising:
controlling the one or more compensating gantries and the build platform gantry to perform a plurality of translational movements; and controlling the one or more sets of mirrors in the one or more compensating gantries and the final set of mirrors in the build platform gantry to perform a plurality of rotations.

20. The apparatus of claim 19, wherein, in controlling the one or more compensating gantries and the build platform gantry to perform a plurality of translational movements, the processor is configured to control a distance of the incident light from the precursor mirror to the location of the top surface of the powder bed by adjusting positions of the one or more sets of mirrors in the one or more compensating gantries and the final set of mirrors in the build platform gantry.

21. The apparatus of claim 19, wherein, in controlling the one or more sets of mirrors in the one or more compensating gantries and the final set of mirrors in the build platform gantry to perform the plurality of rotations, the processor is configured to direct the incident light reflected from the precursor mirror to the location of the top surface of the powder bed by adjusting degrees of rotations of the one or more sets of mirrors in the one or more compensating gantries and the final set of mirrors in the build platform gantry.

* * * * *